United States Patent
Raring et al.

(10) Patent No.: US 9,250,044 B1
(45) Date of Patent: *Feb. 2, 2016

(54) GALLIUM AND NITROGEN CONTAINING LASER DIODE DAZZLING DEVICES AND METHODS OF USE

(71) Applicant: SORRA, INC., Fremont, CA (US)

(72) Inventors: James W. Raring, Fremont, CA (US); Paul Rudy, Fremont, CA (US); Vinod Khosla, Fremont, CA (US); Pierre Lamond, Fremont, CA (US); Steven P. Denbaars, Fremont, CA (US); Shuji Nakamura, Fremont, CA (US); Richard T. Ogawa, Fremont, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 212 days.

This patent is subject to a terminal disclaimer.

(21) Appl. No.: 13/938,048

(22) Filed: Jul. 9, 2013

Related U.S. Application Data

(63) Continuation-in-part of application No. 12/787,343, filed on May 25, 2010, now Pat. No. 8,509,275.

(60) Provisional application No. 61/182,104, filed on May 29, 2009.

(51) Int. Cl.
  *H01J 7/24* (2006.01)
  *F41H 13/00* (2006.01)
  (Continued)

(52) U.S. Cl.
  CPC ........ *F41H 13/0056* (2013.01); *H01S 5/02248* (2013.01); *H01S 5/34333* (2013.01); *H01S 5/4012* (2013.01)

(58) Field of Classification Search
  CPC ..... H01L 37/08; H01L 37/3171; H01L 27/18; H01L 27/08; H01L 27/14
  USPC ........................ 315/111.81; 372/43.01–50.23
  See application file for complete search history.

(56) References Cited

U.S. PATENT DOCUMENTS

| 4,341,592 | A | 7/1982 | Shortes et al. |
| 4,860,687 | A | 8/1989 | Frijlink |

(Continued)

FOREIGN PATENT DOCUMENTS

| CN | 101009347 | 3/1987 |
| CN | 1538534 | 10/2004 |

(Continued)

OTHER PUBLICATIONS

Communication from the Japanese Patent Office re 2012-011589 dated Jul. 4, 2013, 15 pages.

(Continued)

*Primary Examiner* — Quan Tra
(74) *Attorney, Agent, or Firm* — Kilpatrick Townsend & Stockton LLP

(57) ABSTRACT

Laser dazzler devices and methods of using laser dazzler devices are disclosed. More specifically, embodiments of the present invention provide laser dazzling devices power by one or more green laser diodes characterized by a wavelength of about 500 nm to 540 nm. In various embodiments, laser dazzling devices according to the present invention include non-polar and/or semi-polar green laser diodes. In a specific embodiment, a laser dazzling device includes a plurality of green laser diodes.

32 Claims, 13 Drawing Sheets

(51) Int. Cl.
  *H01S 5/343* (2006.01)
  *H01S 5/40* (2006.01)
  *H01S 5/022* (2006.01)

(56) References Cited

U.S. PATENT DOCUMENTS

| | | |
|---|---|---|
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,527,417 A | 6/1996 | Lida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Rorie et al. |
| 6,069,394 A | 5/2000 | Hashimoto et al. |
| 6,072,197 A | 6/2000 | Horino et al. |
| 6,129,900 A | 10/2000 | Satoh et al. |
| 6,147,953 A | 11/2000 | Duncan |
| 6,153,010 A | 11/2000 | Kiyoku et al. |
| 6,195,381 B1 | 2/2001 | Botez et al. |
| 6,239,454 B1 | 5/2001 | Glew et al. |
| 6,273,948 B1 | 8/2001 | Porowski et al. |
| 6,379,985 B1 | 4/2002 | Cervantes et al. |
| 6,398,867 B1 | 6/2002 | D'Evelyn et al. |
| 6,406,540 B1 | 6/2002 | Harris et al. |
| 6,451,157 B1 | 9/2002 | Hubacek |
| 6,489,636 B1 | 12/2002 | Goetz et al. |
| 6,586,762 B2 | 7/2003 | Kozaki |
| 6,596,079 B1 | 7/2003 | Vaudo et al. |
| 6,635,904 B2 | 10/2003 | Goetz et al. |
| 6,639,925 B2 | 10/2003 | Niwa et al. |
| 6,656,615 B2 | 12/2003 | Dwilimski et al. |
| 6,680,959 B2 | 1/2004 | Tanabe et al. |
| 6,686,608 B1 | 2/2004 | Takahira |
| 6,734,461 B1 | 5/2004 | Shiomi et al. |
| 6,755,932 B2 | 6/2004 | Masuda et al. |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,861,130 B2 | 3/2005 | D'Evelyn et al. |
| 6,920,166 B2 | 7/2005 | Akasaka et al. |
| 7,001,577 B2 | 2/2006 | Zimmerman et al. |
| 7,009,199 B2 | 3/2006 | Hall |
| 7,019,325 B2 | 3/2006 | Li et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn |
| 7,078,731 B2 | 7/2006 | D'Evelyn et al. |
| 7,098,487 B2 | 8/2006 | D'Evelyn et al. |
| 7,112,829 B2 | 9/2006 | Picard et al. |
| 7,119,372 B2 | 10/2006 | Stokes et al. |
| 7,125,453 B2 | 10/2006 | D'Evelyn et al. |
| 7,128,849 B2 | 10/2006 | Setlur et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,220,324 B2 | 5/2007 | Baker et al. |
| 7,252,712 B2 | 8/2007 | Dwilinski et al. |
| 7,303,630 B2 | 12/2007 | Motoki et al. |
| 7,312,156 B2 | 12/2007 | Granneman et al. |
| 7,316,746 B2 | 1/2008 | D'Evelyn et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,368,015 B2 | 5/2008 | D'Evelyn et al. |
| 7,381,391 B2 | 6/2008 | Spencer et al. |
| 7,390,359 B2 | 6/2008 | Miyanaga et al. |
| 7,420,261 B2 | 9/2008 | Dwiliski et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,555,025 B2 | 6/2009 | Yoshida |
| 7,569,206 B2 | 8/2009 | Spencer et al. |
| 7,598,104 B2 | 10/2009 | Teng et al. |
| 7,625,446 B2 | 12/2009 | D'Evelyn et al. |
| 7,642,122 B2 | 1/2010 | Tysoe et al. |
| 7,691,658 B2 | 4/2010 | Kaeding et al. |
| 7,704,324 B2 | 4/2010 | D'Evelyn et al. |
| 7,705,276 B2 | 4/2010 | Giddings et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,759,710 B1 | 7/2010 | Chiu et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 7,976,630 B2 | 7/2011 | Poblenz et al. |
| 8,017,932 B2 | 9/2011 | Okamoto et al. |
| 8,021,481 B2 | 9/2011 | D'Evelyn |
| 8,044,412 B2 | 10/2011 | Murphy et al. |
| 8,048,225 B2 | 11/2011 | Poblenz et al. |
| 8,097,081 B2 | 1/2012 | D'Evelyn |
| 8,124,996 B2 | 2/2012 | Raring et al. |
| 8,126,024 B1 | 2/2012 | Raring |
| 8,143,148 B1 | 3/2012 | Raring et al. |
| 8,148,801 B2 | 4/2012 | D'Evelyn |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,278,656 B2 | 10/2012 | Mattmann et al. |
| 8,284,810 B1 | 10/2012 | Sharma et al. |
| 8,294,179 B1 | 10/2012 | Raring |
| 8,303,710 B2 | 11/2012 | D'Evelyn |
| 8,306,081 B1 | 11/2012 | Schmidt et al. |
| 8,314,429 B1 | 11/2012 | Raring et al. |
| 8,323,405 B2 | 12/2012 | D'Evelyn |
| 8,329,511 B2 | 12/2012 | D'Evelyn |
| 8,351,478 B2 | 1/2013 | Raring et al. |
| 8,354,679 B1 | 1/2013 | D'Evelyn et al. |
| 8,355,418 B2 | 1/2013 | Raring et al. |
| 8,427,590 B2 | 4/2013 | Raring et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,451,876 B1 | 5/2013 | Raring et al. |
| 8,461,071 B2 | 6/2013 | D'Evelyn |
| 8,465,588 B2 | 6/2013 | Poblenz et al. |
| 8,509,275 B1 | 8/2013 | Raring et al. |
| 8,510,979 B1 * | 8/2013 | Mortimer ...................... 42/1.08 |
| 8,837,546 B1 | 9/2014 | Raring et al. |
| 2001/0011935 A1 | 8/2001 | Lee et al. |
| 2001/0048114 A1 | 12/2001 | Morita et al. |
| 2002/0027933 A1 | 3/2002 | Tanabe et al. |
| 2002/0050488 A1 | 5/2002 | Nikitin et al. |
| 2002/0085603 A1 | 7/2002 | Okumura |
| 2002/0105986 A1 | 8/2002 | Yamasaki |
| 2002/0171092 A1 | 11/2002 | Goetz et al. |
| 2002/0189532 A1 | 12/2002 | Motoki et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0027014 A1 | 2/2003 | Johnson et al. |
| 2003/0140845 A1 | 7/2003 | D'Evelyn et al. |

(56) References Cited

U.S. PATENT DOCUMENTS

| | | |
|---|---|---|
| 2003/0140846 A1 | 7/2003 | Biwa et al. |
| 2003/0145784 A1 | 8/2003 | Thompson et al. |
| 2003/0178617 A1 | 9/2003 | Appenzeller et al. |
| 2003/0183155 A1 | 10/2003 | D'Evelyn et al. |
| 2003/0200931 A1 | 10/2003 | Goodwin |
| 2003/0209191 A1 | 11/2003 | Purdy |
| 2003/0216011 A1 | 11/2003 | Nakamura et al. |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0146264 A1 | 7/2004 | Auner et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0233950 A1 | 11/2004 | Furukawa et al. |
| 2004/0247275 A1 | 12/2004 | Vakhshoori et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0098095 A1 | 5/2005 | D'Evelyn et al. |
| 2005/0128469 A1 | 6/2005 | Hall et al. |
| 2005/0152820 A1 | 7/2005 | D'Evelyn et al. |
| 2005/0168564 A1 | 8/2005 | Kawaguchi et al. |
| 2005/0205215 A1 | 9/2005 | Giddings et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0247260 A1 | 11/2005 | Shin et al. |
| 2005/0285128 A1 | 12/2005 | Scherer et al. |
| 2006/0030738 A1 | 2/2006 | Vanmaele et al. |
| 2006/0032428 A1 | 2/2006 | Dwilinski et al. |
| 2006/0033009 A1 | 2/2006 | Kobayashi et al. |
| 2006/0037529 A1 | 2/2006 | D'Evelyn |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0060131 A1 | 3/2006 | Atanackovic |
| 2006/0066319 A1 | 3/2006 | Dallenbach et al. |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0177362 A1 | 8/2006 | D'Evelyn et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0207497 A1 | 9/2006 | D'Evelyn et al. |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0256559 A1 | 11/2006 | Bitar |
| 2006/0288928 A1 | 12/2006 | Eom et al. |
| 2007/0036186 A1 | 2/2007 | Corzine et al. |
| 2007/0039226 A1* | 2/2007 | Stokes ............................ 42/146 |
| 2007/0057337 A1 | 3/2007 | Kano et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0101932 A1 | 5/2007 | Schowalter et al. |
| 2007/0105351 A1 | 5/2007 | Motoki et al. |
| 2007/0110112 A1 | 5/2007 | Sugiura |
| 2007/0120141 A1 | 5/2007 | Moustakas et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0153866 A1 | 7/2007 | Shchegrov et al. |
| 2007/0158785 A1 | 7/2007 | D'Evelyn et al. |
| 2007/0163490 A1 | 7/2007 | Habel et al. |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0184637 A1 | 8/2007 | Haskell et al. |
| 2007/0197004 A1 | 8/2007 | Dadgar et al. |
| 2007/0210074 A1 | 9/2007 | Maurer et al. |
| 2007/0215033 A1 | 9/2007 | Maeda et al. |
| 2007/0217462 A1 | 9/2007 | Yamasaki |
| 2007/0218703 A1 | 9/2007 | Kaeding et al. |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0274359 A1 | 11/2007 | Takeuchi et al. |
| 2007/0280320 A1 | 12/2007 | Feezell et al. |
| 2008/0006831 A1 | 1/2008 | Ng |
| 2008/0025360 A1 | 1/2008 | Eichler et al. |
| 2008/0029152 A1 | 2/2008 | Milshtein et al. |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0156254 A1 | 7/2008 | Dwilinski et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0193363 A1 | 8/2008 | Tsuji |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0092536 A1 | 4/2009 | Kawabata et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0218593 A1 | 9/2009 | Kamikawa et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0316116 A1 | 12/2009 | Melville et al. |
| 2009/0320744 A1 | 12/2009 | D'Evelyn |
| 2009/0320745 A1 | 12/2009 | D'Evelyn et al. |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0006546 A1 | 1/2010 | Young et al. |
| 2010/0006873 A1 | 1/2010 | Raring et al. |
| 2010/0025656 A1 | 2/2010 | Raring et al. |

(56) References Cited

U.S. PATENT DOCUMENTS

| | | |
|---|---|---|
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0044718 A1 | 2/2010 | Hanser et al. |
| 2010/0075175 A1 | 3/2010 | Poblenz et al. |
| 2010/0096615 A1 | 4/2010 | Okamoto et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0140745 A1 | 6/2010 | Khan et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0304874 A1* | 12/2010 | Abatemarco ............... 463/47.3 |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0062415 A1 | 3/2011 | Ohta et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0064103 A1 | 3/2011 | Ohta et al. |
| 2011/0073888 A1 | 3/2011 | Ueno et al. |
| 2011/0075694 A1 | 3/2011 | Yoshizumi et al. |
| 2011/0100291 A1 | 5/2011 | D'Evelyn |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0180781 A1 | 7/2011 | Raring et al. |
| 2011/0183498 A1 | 7/2011 | D'Evelyn |
| 2011/0186874 A1 | 8/2011 | Shum |
| 2011/0186887 A1 | 8/2011 | Trottier et al. |
| 2011/0216795 A1 | 9/2011 | Hsu et al. |
| 2011/0220912 A1 | 9/2011 | D'Evelyn |
| 2011/0247556 A1 | 10/2011 | Raring et al. |
| 2011/0256693 A1 | 10/2011 | D'Evelyn et al. |
| 2011/0262773 A1 | 10/2011 | Poblenz et al. |
| 2011/0281422 A1 | 11/2011 | Wang et al. |
| 2011/0286484 A1 | 11/2011 | Raring et al. |
| 2012/0000415 A1 | 1/2012 | D'Evelyn et al. |
| 2012/0073494 A1 | 3/2012 | D'Evelyn |
| 2012/0091465 A1 | 4/2012 | Krames et al. |
| 2012/0104359 A1 | 5/2012 | Felker et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0178198 A1 | 7/2012 | Raring et al. |
| 2012/0187371 A1 | 7/2012 | Raring et al. |
| 2012/0199952 A1 | 8/2012 | D'Evelyn et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |
| 2013/0119401 A1 | 5/2013 | D'Evelyn et al. |

FOREIGN PATENT DOCUMENTS

| | | |
|---|---|---|
| CN | 1702836 | 11/2005 |
| CN | 101079463 | 11/2007 |
| CN | 101099245 | 1/2008 |
| CN | 1171692 | 4/2008 |
| JP | 3-287770 | 12/1991 |
| JP | 07-162081 | 6/1995 |
| JP | 2002-009402 | 1/2002 |
| JP | 2002-185082 | 6/2002 |
| JP | 2004-503923 | 2/2004 |
| JP | 2004-152841 | 5/2004 |
| JP | 2004-186527 | 7/2004 |
| JP | 2005-289797 | 10/2005 |
| JP | 2006-091285 | 4/2006 |
| JP | 2006-120923 | 5/2006 |
| JP | 2007-173467 A | 7/2007 |
| JP | 2007-529910 | 10/2007 |
| JP | 2007-068398 | 4/2008 |
| JP | 2008-311640 | 12/2008 |
| JP | 2009-021506 | 1/2009 |
| JP | 2009-158893 | 7/2009 |
| JP | 2009-170708 | 7/2009 |
| WO | 2006/057463 | 1/2006 |
| WO | 2007/004495 | 11/2007 |
| WO | 2008-041521 A1 | 4/2008 |
| WO | 2010/068916 | 6/2010 |
| WO | WO 2010/120819 | 10/2010 |
| WO | 2012/016033 | 2/2012 |

OTHER PUBLICATIONS

USPTO Notice of Allowance for U.S. Appl. No. 12/789,303 dated Dec. 21, 2012, 5 pages.

USPTO Notice of Allowance for U.S. Appl. No. 13/853,694 dated Sep. 3, 2013, 8 pages.

Notice of Allowance of Sep. 16, 2014 for U.S. Appl. No. 13/752,158, 9 pages.

Notice of Allowance of Mar. 28, 2014, 2014 for U.S. Appl. No. 13/937,981, 34 pages.

Final Office Action of Apr. 1, 2014 for U.S. Appl. No. 13/752,158, 27 pages.

Abare "Cleaved and Etched Facet Nitride Laser Diodes," IEEE Journal of Selected Topics in Quantum Electronics, vol. 4, No. 3, pp. 505-509 (May 1998).

Aoki et al., "InGaAs/InGaAsP MQW Electroabsorption Modulator Integrated with a DFB Laser Fabricated by Band-Gap Energy Control Selective Area MOCVD, 1993,"IEEE J Quantum Electronics, vol. 29, pp. 2088-2096.

Asano et al., "100-mW kink-Free Blue-Violet Laser Diodes with Low Aspect Ratio," 2003, IEEE Journal of Quantum Electronics, vol. 39, No. 1, pp. 135-140.

Asif Khan "Cleaved cavity optically pumped InGaN—GaN laser grown on spinel substrates," Appl. Phys. Lett. 69 (16), pp. 2418-2420 (Oct. 14, 1996).

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OMVPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

D'Evelyn et al., "Bulk GaN Crystal Growth by the High-Pressure Ammonothermal Method," Journal of Crystal Growth, 2007, vol. 300, pp. 11-16.

Franssila, 'Tools for CVD and Epitaxy', Introduction to Microfabrication, 2004, pp. 329-336.

Fujii et al., "Increase in the Extraction Efficiency of GaN-based Light-Emitting Diodes Via Surface Roughening," 2004, Applied Physics Letters, vol. 84, No. 6, pp. 855-857.

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.

Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.

Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.

(56) References Cited

OTHER PUBLICATIONS

Gardner et al. "Blue-emitting InGaN-GaN double-heterostructure light-emitting diodes reaching maximum quantum efficiency above 200 A/cm2", Applied Physics Letters 91, 243506 (2007).
hap ://techon.nikkeibp. co jp/english/NEWS_EN/20080122/146009.
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962
Kendall et al., "Energy Savings Potential of Solid State Lighting in General Lighting Applications," 2001, Report for the Department of Energy, pp. 1-35.
Kim et al, "Improved Electroluminescence on Nonpolar m-plane InGaN/GaN Qantum Well LEDs", 2007, Physica Status Solidi (RRL), vol. 1, No. 3, pp. 125-127.
Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.
Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Masui et al. "Electrical Characteristics of Nonpolar InGaN-Based Light-Emitting Diodes Evaluated at Low Temperature," Jpn. J. Appl. Phys. 46 pp. 7309-7310 (2007).
Michiue et al. "Recent development of nitride LEDs and LDs," Proceedings of SPIE, vol. 7216, 72161Z (2009).
Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.
Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.
Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Park, "Crystal orientation effects on electronic properties of wurtzite InGaN/GaN quantum wells," Journal of Applied Physics vol. 91, No. 12, pp. 9904-9908 (Jun. 2002).
Purvis, "Changing the Crystal Face of Gallium Nitride." The Advance Semiconductor Magazine, vol. 18, No. 8, Nov. 2005.
Romanov "Strain-induced polarization in wurtzite III-nitride semipolar layers," Journal of Applied Physics 100, pp. 023522-1 through 023522-10 (Jul. 25, 2006).
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Schoedl "Facet degradation of GaN heterostructure laser diodes," Journal of Applied Physics vol. 97, issue 12, pp. 123102-1 to 123102-8 (2005).
Shchekin et al., "High Performance Thin-film Flip-Chip InGaN—GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1-071001-3.
Tomiya et al. Dislocation related issues in the degradation of GaN-based laser diodes, IEEE Journal of Selected Topics in Quantum Electronics vol. 10, No. 6 (2004).
Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.
Tyagi et al., 'Semipolar (1011) InGaN/GaN Laser Diodes on Bulk GaN Substrates,' Japanese Journal of Applied Physics, vol. 46, No. 19, 2007, pp. L444-L445.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Uchida et al.,"Recent Progress in High-Power Blue-violet Lasers," 2003, IEEE Journal of Selected Topics in Quantum Electronics, vol. 9, No. 5, pp. 1252-1259.
Waltereit et al., "Nitride Semiconductors Free of Electrostatic Fields for Efficient White Light-emitting Diodes," 2000, Nature: International Weekly Journal of Science, vol. 406, pp. 865-868.
Wierer et al., "High-power AlGaInN Flip-chip Light-emitting Diodes," 2001, Applied Physics Letters, vol. 78, No. 22, pp. 3379-3381.
Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Yoshizumi et al. "Continuous-Wave operation of 520 nm Green InGaN-Based Laser Diodes on Semi-Polar {20-21} GaN Substrates," Applied Physics Express 2 (2009).
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
International Search Report of PCT Application No. PCT/US2009/047107, dated Sep. 29, 2009, 4 pages.
International Search Report of PCT Application No. PCT/US2009/046786, dated May 13, 2010, 2 pages.
International Search Report of PCT Application No. PCT/US2009/52611, dated Sep. 29, 2009, 3 pages.
International Search Report & Written Opinion ofPCT Application No. PCT/US2010/030939, dated Jun. 16, 2010, 9 pages.
International Search Report & Written Opinion of PCT Application No. PCT/US2010/049172, dated Nov. 17, 2010, 7 pages.
International Search Report of PCT Application No. PCT/US2011/037792, dated Sep. 8, 2011, 2 pages.
International Search Report of PCT Application No. PCT/US2009/067745, dated Feb. 5, 2010, 1 page total.
Choi et al., 2.51 microcavity InGaN light-emitting diodes fabricated by a selective dry-etch thinning process, Applied Physics Letters, 2007, 91(6), 061120.
Fukuda et al., 'Prospects for the Ammonothermal Growth of Large GaN Crystal,' Journal of Crystal Growth, vol. 305, 2007, pp. 304-310.
Lide et al., 'Thermal Conductivity of Ceramics and Other Insulating Materials,' CRC Handbook of Chemistry and Physics, 91st Edition, 2010-2011, pp. 12-203 and 12-204.

(56) References Cited

OTHER PUBLICATIONS http://www.matbase.com/material/non-ferrous-metals/other/molybdenum/properties, Data Table For: Non-Ferrous Metals: Other Metals: Molybdenum, Mar. 28, 2011, pp. 1.
Pattison et al., 'Gallium Nitride Based Microcavity Light Emitting Diodes With 2? Effective Cavity Thickness', Applied Physics Letters, vol. 90, Issue 3, 031111 (2007) 3 pg.
Sarva et al., 'Dynamic Compressive Strength of Silicon Carbide Under Uniaxial Compression,' Material Sciences and Engineering, vol. A317, 2001, pp. 140-144.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, I p. 1-19 (2004).
Altoukhov et al., 'High reflectivity airgap distributed Bragg reflectors realized by wet etching of AlInN sacrificial layers', Applied Physics Letters, vol. 95, 2009, pp. 191102-1-3.
Callahan et al., 'Synthesis and Growth of Gallium Nitride by the Chemical Vapor Reaction Process (CVRP)', MRS Internet Journal Nitride Semiconductor Research, vol. 4, No. 10, 1999, pp. 1-6.
Dorsaz et al., 'Selective oxidation of AlInN Layers for current confinement III-nitride devices', Applied Physics Letters, vol. 87, 2005, pp. 072102.
Ehrentraut et al., 'The ammonothermal crystal growth of gallium nitride-A technique on the up rise', Proceedings IEEE, 2010, 98(7), pp. 1316-1323.
Fang, 'Deep centers in semi-insulating Fe-doped native GaN substrates grown by hydride vapour phase epitaxy', Physica Status Solidi, vol. 5, No. 6, 2008, pp. 1508-1511.
Fujito et al., 'Development of bulk GaN crystals and nonpolar/semipolar substrates by HVPE', MRS Bulletin, 2009, 34, 5, pp. 313-317.
Gladkov et al., 'Effect of Fe doping on optical properties of freestanding semi-insulating HVPE GaN:Fe', Journal of Crystal Growth, 312, 2010, pp. 1205-1209.
Grzegory, 'High pressure growth of bulk GaN from Solutions in gallium', Journal of Physics Condensed Matter, vol. 13, 2001, pp. 6875-6892.
Moutanabbir, 'Bulk GaN Ion Cleaving', Journal of Electronic Materials, vol. 39, 2010, pp. 482-488.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, 2005, pp. 103509-1-103509-4.
Porowski, 'High Resistivity GaN Single Crystalline Substrates', Acta Physica Polonica A, vol. 92, No. 5, 1997, pp. 958-962.
Porowski, 'Near Defect Free GaN Substrates', Journal of Nitride Semiconductor, 1999, pp. 1-11.
Sharma et al., 'Vertically oriented GaN-based air-gap distributed Bragg reflector structure fabricated using band-gap-selective photoelectrochemical etching', Applied Physics Letters, vol. 87, 2005, pp. 051107.
Wang et al., 'Ammonothermal Growth of GaN Crystals in Alkaline Solutions', Journal of Crystal Growth, vol. 287, 2006, pp. 376-380.
Non-Final Office Action of Dec. 17, 2012 for U.S. Appl. No. 12/787,343, 8 pages.
Notice of Allowance of Jun. 10, 2013, 2013 for U.S. Appl. No. 12/787,343, 12 pages.
Non-Final Office Action of Oct. 7, 2013 for U.S. Appl. No. 13/752,158, 21 pages.
Notice of Allowance of Nov. 27, 2013, 2013 for U.S. Appl. No. 13/937,981, 12 pages.

* cited by examiner

GALLIUM AND NITROGEN CONTAINING LASER DIODE DAZZLING DEVICES AND METHODS OF USE

This applications is a continuation in part of U.S. application Ser. No. 12/787,343 filed on May 25, 2010, now allowed, which claims priority to U.S. Provisional Application No. 61/182,104 filed on May 29, 2009, each of which is incorporated by reference in its entirety.

BACKGROUND

The present invention is related to laser devices. More specifically, embodiments of the present invention combine blue and/or green laser diode devices with offensive or defensive non-lethal and lethal weapon technologies to form a multi-stage weapon device capable of various levels of deterrence and/or lethality. In various embodiments, a green or blue laser diode devices function to create a dazzling effect, function to point toward a specific location or target, or function to sight for targeting and/or aiming purposes. In a specific embodiment, laser diode devices are combined with pepper spray, a Taser apparatus, a rubber projectile firing gun, and/or a lethal firearm. The laser devices can include a plurality of blue and green laser diodes, which may couple power together.

As human beings become more civilized, non-lethal techniques have been developed to temporarily halt others that may be dangerous or hostile. In any potentially hostile situation such as a military security checkpoint, a critical need exists to identify potentially threatening individuals or groups prior to undertaking an escalation of force. Non-lethal threat detection and deterrent techniques are commonly used such as megaphones, tire spike strips, traffic cones, fencing, and hand gestures. However, many of these are impractical in impromptu security environments, and such measures may not show sufficient force to deter potentially hostile parties. If a serious threat is encountered or anticipated, warning shots can be fired, but this action can actually accelerate tensions and result in unwanted and unnecessary escalation of force if the shots are perceived incorrectly by an approaching party. Moreover, once the warning shots have been fired, a common next step in the escalation of force is to engage the approaching party directly with gunfire, which dramatically increases the likelihood of loss of life.

As a result, an intermediate means of threat detection using bright light has been developed and employed called laser dazzling. This measure provides less than lethal threat detection, assessment, and an opportunity for de-escalation while at the same time providing a strong visual warning which can "dazzle" or induce temporary blindness to disorient approaching hostile parties without causing permanent ocular damage. End users of these tools include soldiers on the battlefield, homeland security officers, police, and general security who find themselves in any potentially hostile situation.

An application of bright light for threat detection and deterrence goes back to early in the 20th century when soldiers used searchlights for this purpose. As lasers were developed in the 1960s, they became more portable, and by the 1980s, defense and security forces were using lasers as dazzlers because of their long-range capability resulting from their collimated beam output. In the 1990s, the United Nations enacted the Protocol on Blinding Laser Weapons, which outlawed weapons intended to cause permanent blindness, but which leave the door open to weapons which induce temporary blindness.

Laser dazzlers are a common tool in the defense and security market. They go by several names, including laser dazzler, nonlethal visual disrupter, visual warning technology, nonlethal lasers, and others. In conventional laser dazzlers, green lasers are often employed. In order to generate the green laser light in conventional laser dazzlers, a three stage laser is often required, typically referred to as a diode pumped solid state (DPSS) frequency doubled green laser. A conventional laser design typically includes:

A laser diode emitting 808 nm laser light (typically powered by a battery).

The 808 nm laser is then focused into a solid state lasing crystal based on Nd:YAG or Nd:YVO$_4$. The crystals emit laser light at or near 1064 nm.

The 1064 nm is then incident on a frequency doubling crystal which creates green light through the second harmonic generation process where two 1064 nm photons are converted into a single 532 nm photon. The frequency doubling crystal is typically KTP, LBO, BBO, PPLN, or another similar material. While these conventional laser dazzling devices are useful, there are certain drawbacks. For example, conventional laser dazzlers are often complex and require sophisticated optics and configurations. Additionally, such laser dazzlers are also expensive and difficult to scale.

Unfortunately, crime continues. "A man and a woman were robbed at gunpoint near downtown Palo Alto on Tuesday night, police said. The victims, a man in his 50s and a woman in her 20s, were walking northbound on the 300 block of Ramona Street at about 8:30 p.m. when they were approached by a man, police said. He allegedly blocked the sidewalk, drew a black handgun, and demanded their wallets and the woman's purse. After handing over their things, the victims were ordered to turn around and walk in the other direction, police said. They then heard the man run away northbound on Ramona Street. The victims arrived at a restaurant on the 400 block of Emerson Street about 10 or 15 minutes after the robbery and told staff what had happened, police said. An employee called police, who searched the area but could not find the man." By Jason Green, Daily News Staff Writer, San Jose Mercury News, Jan. 24, 2013.

Therefore, it can appreciated that improved systems and methods for laser dazzling devices are desirable.

SUMMARY

According to the present invention, laser devices are provided. More specifically, embodiments of the present invention combine blue and/or green laser diode devices with offensive and/or defensive non-lethal and/or lethal weapon technologies to form a multi-stage weapon device capable of various levels of deterrence and/or lethality. In various embodiments, green and/or blue laser diode devices function to create a dazzling effect, but can also function as a pointer device to point toward a specific location or target, or function for weaponry sighting. In a specific embodiment, green laser diode devices are combined with pepper spray, combined with a Taser apparatus, combined with a rubber projectile firing gun, and/or combined with a lethal firearm. The laser devices can include a plurality of blue and green laser diodes, which may be coupled to a form a single laser beam. Embodiments of the present invention provide laser dazzling devices powered by one or more green laser diodes characterized by one or more wavelengths from about 500 nm to 540 nm, from 500 nm to 568 nm, from 420 nm to 568 nm, or from 420 nm to 500 nm. In various embodiments, laser dazzling devices include polar, non-polar, and/or semi-polar green laser diodes. In a specific embodiment, a single laser dazzling device includes a plurality of green laser diodes.

In a specific embodiment, the present invention includes certain features for a laser dazzler including:

Wavelength: A laser dazzler can be configured to output green light because the eye is most sensitive to green wavelengths. Specifically, for the same amount of optical power, the human eye is typically more than 5 times more sensitive to green light compared to red or blue light in daylight conditions.

Power: Output optical power of a laser dazzler can ranges from 5 mW to 500 mW. It is to be noted that these power levels exceed the FDA's eye-safe power of a laser pointer (5 mW). As a result, the laser dazzler may be specified with a Nominal Ocular Hazard Distance (NOHD), which is the distance at which one can potentially cause eye injuries if used on anyone up to that distance. For example, a laser dazzler may have an NOHD of 45 meters.

In addition to the laser, other features include telescoping optics to collimate a laser beam to a large or small spot at a given range, batteries, mechanics for handheld operation and integration with small arms, sighting, etc.

Minimal power consumption in order to minimize size, cost, weight of the battery and of the thermal management system.

Ruggedness over temperature, shock, vibration.

Compact size.

Lightweight.

Low cost.

According to certain embodiments, the present invention provides a laser dazzling apparatus. The laser dazzling apparatus may be capable of providing a non-lethal deterrent, warning, or halting effect on a human subject or group of human subjects. The laser dazzling apparatus can include a housing member. The laser dazzling apparatus can include one or more laser devices. A laser device may comprise at least a gallium and nitrogen containing device having an active region and a cavity member. The laser device can be configured to emit a laser beam characterized by one or more wavelengths from about 500 nm to 540 nm, from about 420 nm to about 500 nm, and/or from about 420 nm to about 540 nm. The active regions can include a gallium nitride material. In certain embodiment, the laser beam being characterized by a first direction. The laser dazzling apparatus may include a driving circuit electrically coupled to the one or more laser devices. The driving circuit is adapted to deliver electrical energy to the laser device. The electrical energy is less than 800 mW. The laser dazzling apparatus may include a power source electrically coupled to the driving circuit. The laser dazzling apparatus may include an activation module electrically coupled to the driving circuit. The activation module can be configured to send an activation signal to the driving circuit. The laser dazzling apparatus may include a sight for aligning the laser beam such as, for example, aligning and directed the laser beam to a desired position.

According to certain embodiments, the present invention provides a laser dazzling device. The laser dazzling device can be capable of providing a non-lethal deterrent, warning, or halting effect on a human subject or group of human subjects. The laser dazzling device may include one or more laser devices. In certain embodiments, a laser device comprises a green laser diode. A green laser diode may comprise an active region and a cavity member. A green laser diode may be configured to emit a laser beam at an intensity level of less than 800 mW. The active region can include a nitride gallium and nitrogen containing material. The laser beam can be characterized by a first direction. The laser dazzling device may include a driving circuit electrically coupled to the laser device. The driving circuit may be adapted to deliver electrical energy to the laser device. The electrical energy may be less than 800 mW. A laser dazzling device may include a power source electrically coupled to the driving circuit. The laser dazzling device include an activation module electrically coupled to the driving circuit. The activation module can be configured to send an activation signal to the driving circuit, the activation module comprising an electrical trigger. The laser dazzling device may include a sight for targeting and/or aligning the laser beam such as, for example, to a desired position.

In certain embodiments, a laser diode comprises a gallium and nitrogen containing substrate. A gallium and nitrogen containing substrate can be configured in polar, nonpolar, or a semi-polar surface orientation. A laser diode can be configured to emit a laser beam characterized by at least one wavelength from about 490 nm to 540 nm, from about 420 to about 500 nm, from about 500 nm to 540 nm. A laser dazzling apparatus or laser dazzling device may include a plurality of laser diodes, each of the diodes emitting at the same wavelength or wavelengths, or may include a plurality of laser diodes, at least some of which emit at different wavelengths. The apparatus includes a power source electrically coupled to a laser device.

According to certain embodiments, the present invention provides a laser pointing device. The laser pointer device capable of accurately pointing at a target by shining a laser beam directly on the subject. The laser pointing device includes a laser device. The laser device comprises a green laser diode and/or a blue laser diode. The laser diode comprises an active region and a cavity member. The green or blue laser diode can be configured to emit a laser beam at an intensity level of less than 800 mW. The active region includes a gallium and nitrogen containing material. The laser beam can be characterized by a first direction. The laser pointer device includes a driving circuit electrically coupled to the laser device. The driving circuit is adapted to deliver electrical energy to the laser device. The electrical energy is less than 800 mW. The laser pointer device includes a power source electrically coupled to the driving circuit. The laser pointer device includes an activation module electrically coupled to the driving circuit. The activation module can be configured to send an activation signal to the driving circuit, the activation module comprising an electrical trigger. In an alternative specific embodiment, the present invention provides a laser pointer apparatus. The laser pointer apparatus includes a laser device including a laser diode. The laser diode comprises a gallium and nitrogen containing substrate configured in a polar, nonpolar, or semi-polar orientation in one or more embodiments. In one embodiment the laser diode is configured to emit a laser beam characterized by at least a wavelength of about 490 nm to 540 nm according to a specific embodiment. The apparatus includes a power source electrically coupled to the laser device in a specific embodiment.

According to another embodiment, the present invention provides a laser sighting or aiming device. The laser aiming device capable of accurately aiming a weapon at a subject such that if the weapon is activated the subject will be struck. The laser aiming device includes a laser device. The laser aiming device comprises a green laser diode and/or a blue laser diode. The laser diode comprises an active region and a cavity member. The laser diode can be configured to emit a laser beam at an intensity level of less than 800 mW. The active region includes a gallium and nitrogen containing material. The laser beam can be characterized by a first direction. The laser aiming device includes a driving circuit electrically coupled to the laser device. The driving circuit is adapted to deliver electrical energy to the laser device. The electrical energy is less than 800 mW. The laser aiming device includes a power source electrically coupled to the driving circuit. The laser aiming device includes an activation module electrically coupled to the driving circuit. The activation module can be configured to send an activation signal to the driving circuit, the activation module comprising an electrical trigger. In an alternative specific embodiment, the present invention provides a laser pointer apparatus. The laser aiming apparatus includes a laser device including a laser diode. The laser diode comprises a gallium and nitrogen containing substrate configured in a polar, nonpolar, or semi-polar orientation in one or more embodiments. In one embodiment the laser diode is configured to emit a laser beam characterized by at least a wavelength of about 490 nm to 540 nm according to a specific embodiment. The apparatus includes a power source electrically coupled to the laser device in a specific embodiment.

The present invention combines one or more of the laser devices such as the dazzler device, the laser pointer device, or the laser aiming with another weapon or deterrent device to form a multi-stage weapon or deterrent device. The novel multi-stage weapon or deterrent device will provide the user with various levels of force to apply to the subject. Such stages may range from a simple laser pointer device incident on the subject such that the subject realizes he/she is identified for escalated force if they do not comply with orders, to laser a dazzling device capable of overloading the subject's senses and rendering them temporarily incapacitated, to application of pepper spray to the subject's eyes such that the subject is temporarily blinded, to projecting rubber bullets at the subject to physically bruise or knock down the subject, and finally to a fatal weapon such as a live firearm.

In one such embodiment of this invention the laser device is combined with a Taser device capable of applying an electroshock. The electroshock is realized by injecting an electrical current into the subject, which disrupts voluntary control of muscles causing "neuromuscular incapacitation". In this embodiment, the laser device could be a dazzling device such that before the user engages the Taser the user will engage the less lethal dazzling device in effort to make the subject comply. If the subject does not comply with use of the dazzling device, the user would then engage the Taser device to expose the subject to a more severe electrical shock. In a variation of this embodiment, a chemical agent such as pepper spray or mace is used in place of or combined with the Taser device. The chemical agent would have a similar function as the Taser devices, which is to apply a more lethal impact to the subject relative to the dazzling device. An extension to this embodiment is to use laser pointer devices to project a laser beam on the subject. By projecting the laser beam on the subject the subject will be made aware that more severe force will be used if he/she does not comply. The pointer device represents the lowest lethality. If the subject does not comply the user can engage the dazzling device. The dazzling device may comprise of the same laser diodes comprising the pointer device, but with the dazzling device operating at higher power. For example, the pointer device may operate between 5 mW and 25 mW whereas the dazzler device may operate between 25 mW and 800 mW. If the dazzling device is not effective in subduing the subject, the user could then apply the Taser or pepper spray device. In a further embodiment of this invention, the multi-stage weapon could comprise a firearm. In this embodiment, the user could apply lethal force to the non-compliant subject following application of the Taser and/or pepper spray.

It is to be appreciated that embodiments of the present invention provides numerous advantages over conventional techniques. According to the present invention, a laser dazzling device implemented using one or more green laser diodes based on GaN technology has the numerous advantages over existing DPSS approaches.

Efficiency: Because the GaN diode laser is a single stage, it is inherently more efficient and therefore requires less powerful batteries, decreasing the size, weight and cost. Moreover, the efficient generation of light minimizes waste heat, which needs to be managed and carried away which further reduces size, weight, and cost.

Ruggedness and elimination of alignment: The green laser light is generated within the chip, so external optical alignment is not required to maintain lasing. This dramatically reduces cost in the manufacturing process and also eliminates failure mechanisms for the use in the field.

Broad temperature operation: The GaN diode laser approach is not sensitive to minor changes in temperature. Therefore, requirements for several control are eliminated including sensors for temperature and/or light, along with active temperature controls such as heaters or thermoelectric coolers. This greatly reduces the system complexity, cost, size, and weight, and eliminates failure mechanisms.

Elimination of the dangerous of the residual 1064 nm beam: This GaN design produces only a green laser beam and does not produce a 1064 nm beam. This eliminates the blocking filter reducing cost, and eliminating the risk of emitting an extremely dangerous infrared beam.

Design flexibility in wavelength: By using the GaN approach, it is possible to achieve a slightly different wavelength such as 515 nm or 500 nm from the device. Such flexibility is important for dazzlers designed for dark environments, where the eye's sensitivity shifts and 500 nm is actually 20% brighter to the eye than light at 530 nm. Moreover, the flexible design enables one to fabricate a slightly different green wavelength which may be useful in preventing hostile parties from using 532 nm narrow band filter to avoid the effect of dazzling.

According to specific embodiments, green laser diodes (using nonpolar and/or semipolar GaN) for non-lethal threat detection, threat assessment, threat de-escalation, visual warning technology, and laser dazzling are provided.

The present invention achieves these benefits and others in the context of known process technology. However, a further understanding of the nature and advantages of the present invention may be realized by reference to the latter portions of the specification and attached drawings.

DETAILED DESCRIPTION

Figure 1:
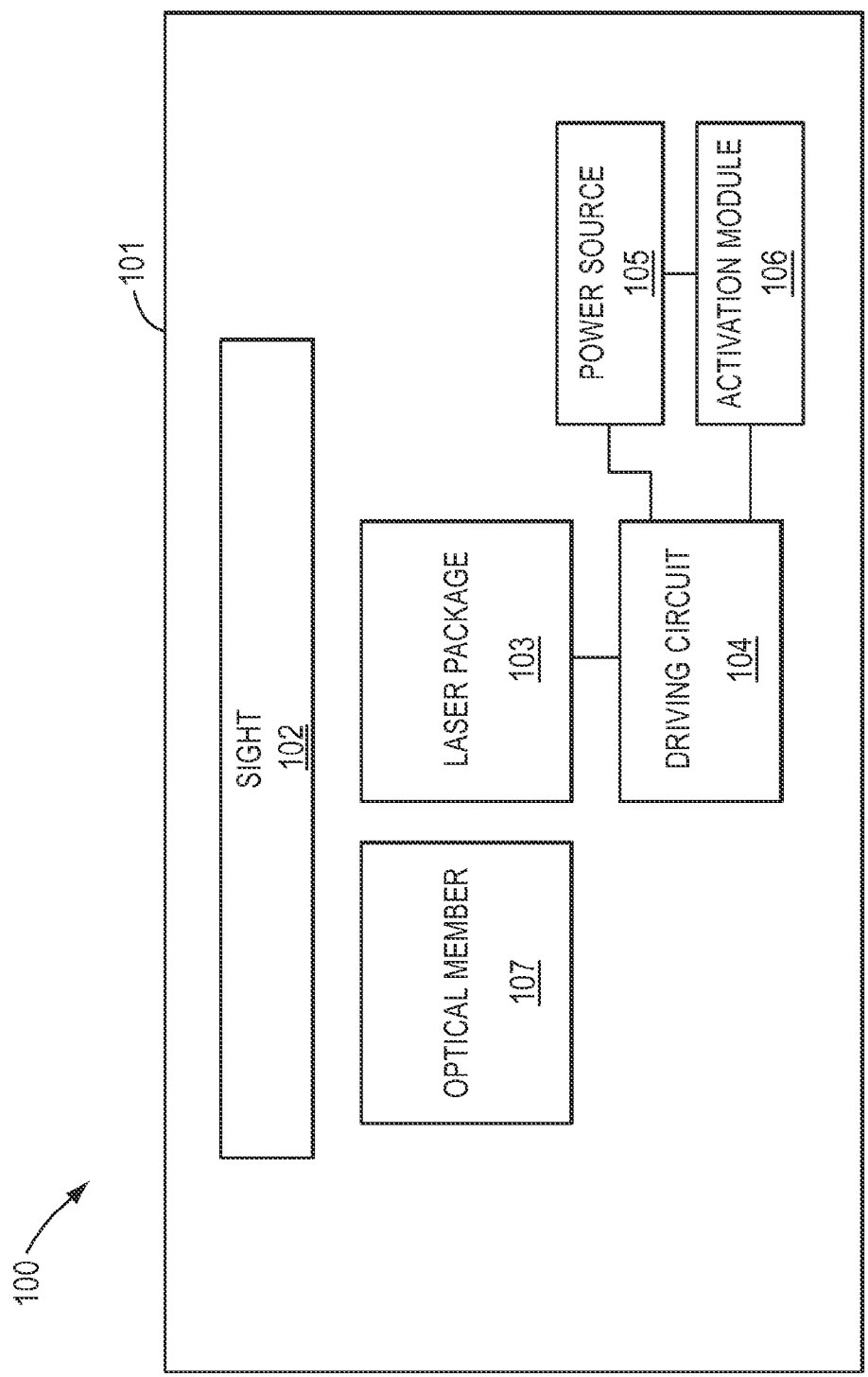
FIG. 1 is a simplified block diagram illustrating a laser dazzling device according to an embodiment of the present invention.

According to the present invention, laser devices are provided. More specifically, embodiments of the present invention combine blue and/or green laser diode devices with offensive or defensive non-lethal and lethal weapon technologies to form a multi-stage weapon device capable of various levels of lethality. In various embodiments, the green or blue laser diode devices function to create a dazzling effect, but can also function as a pointer device to point toward a specific location or target, or function for weaponry sighting. In a specific embodiment, green laser diode devices are combined with pepper spray, combined with a Taser apparatus, combined with a rubber projectile firing gun, and/or combined a lethal firearm. The laser device can include a plurality of blue and green laser diodes, which may couple power together. Embodiments of the present invention provide laser dazzling devices power by one or more green laser diodes characterized by a wavelength of about 500 nm to 540 nm. In various embodiments, laser dazzling devices include a polar, non-polar, and/or semi-polar green laser diodes. In a specific embodiment, a single laser dazzling device includes a plurality of green laser diodes.

As described above, conventional laser devices are often inadequate for various reasons. More specifically, conventional DPPS laser devices are often inefficient. Although the three stage DPSS lasers do generate green laser light for the application today, several critical limitations of this design are noted below:

Inefficiency: Because each of the three processes is not perfectly efficient and has inherent loss, these green DPSS lasers are inefficient and therefore require powerful batteries to drive them, increasing the size, weight and cost. Moreover, the inefficient generation of light results in waste heat which needs to be managed and carried away which adds to the bulk and expense.

Fragility and sensitivity to alignment: It is absolutely critical to align each of the beams and crystals and optics with respect to one another in order to generate the green light. If misalignment occurs in assembly or in application, the green laser light generation will cease altogether. This adds cost in the manufacturing process and also presents failure mechanisms for the use in the field.

Temperature sensitivity: To achieve the 808 nm conversion to 1064 nm and the 1064 nm conversion to 532 nm, the temperature of the diode laser and/or crystals needs to be precisely controlled. Minor changes in temperature beyond a few degrees C. can cause the green light generation process to decrease substantially or cease altogether. To overcome this, sensors for temperature and/or light along with active temperature controls such as heaters or thermoelectric coolers are employed to maintain lasing at a selected wavelength or wavelength range. These measures add to the systems cost, size, and weight, and present additional failure mechanisms.

Danger of the residual 1064 nm beam: The DPSS design produces a 1064 nm laser beam with power several times that of the green beam. While some of this light is converted to the green, residual 1064 nm laser light is inherent in the system since the frequency conversion process is not perfect. This residual infrared laser beam is typically blocked by the manufacturer using a filter, which adds cost. If the filter were somehow to fail and the residual 1064 nm beam emitted, the 1064 nm beam would be extremely dangerous because it is invisible to the human eye and may have sufficient power to cause blindness.

Fixed wavelength at 532 nm prevents flexible designs: Use of the DPSS approach results in a single wavelength output that is a property of the crystals used. It is not possible to achieve a slightly different wavelength such as 515 nm or 500 nm from the device unless another crystal were used, which is not practical at the present time Such flexibility would be attractive because in dark environments the sensitivity of the eye shifts and light at a wavelength of 500 nm appears 20% brighter than light at 530 nm. Moreover, hostile parties may attempt to use narrow band filters to avoid the effects of dazzling, and using a slightly different green wavelength would be useful to avoid these and similar countermeasures.

In various embodiments, the present invention provides laser dazzling devices implemented using green laser diodes that directly produces green laser beams. More specifically, by utilizing a GaN diode laser that directly produces a green laser beam from a single stage design, one can efficiently produce a green beam from a tiny laser chip and eliminate or mitigate the disadvantages of existing DPSS systems in the field of laser dazzlers. According to the present invention, a green laser diode based on GaN technology would have the following advantages over existing DPSS approaches:

Efficiency: Because the GaN diode laser is a single stage, it is inherently more efficient and therefore requires less powerful batteries, decreasing the size, weight and cost. Moreover, the efficient generation of light minimizes waste heat that otherwise must be managed and dissipated, which further reduces size, weight, and cost.

Ruggedness and elimination of alignment: The green laser light is generated within the chip such that external optical alignment is not required to maintain lasing. This dramatically reduces cost in the manufacturing process and also eliminates failure mechanisms during use in the field.

Broad temperature operation: The GaN diode laser approach is not sensitive to minor changes in temperature. Therefore, requirements for thermal control are eliminated including sensors for temperature and/or light, along with active temperature controls such as heaters or thermoelectric coolers. This greatly reduces the system complexity, cost, size, and weight, and eliminates failure mechanisms.

Elimination of the dangerous of the residual 1064 nm beam: The GaN design produces only a green laser beam and does not produce a 1064 nm beam. This eliminates the blocking filter reducing cost, and eliminating the risk of emitting an extremely dangerous infrared beam.

Design flexibility in wavelength: By using the GaN approach, it is possible to achieve a slightly different emission wavelength such as 515 nm or 500 nm from the device. Such flexibility is important for dazzlers designed for dark environments, where the sensitivity of the eye shifts such that light at a wavelength of 500 nm appears 20% brighter than light at 530 nm. Moreover, the flexible design enables one to fabricate a slightly different green wavelength, which may be useful in preventing hostile parties from using 532 nm narrow band filter to avoid the effect of dazzling.

FIG. 1 is a simplified block diagram illustrating a laser dazzling device according to an embodiment of the present invention. As shown in FIG. 1, a laser dazzling device 100 includes a housing 101, a sight 102, a laser device 103, a driving circuit 104, a power source 105, an activation module 106, and an optical member 107.

According to certain embodiments, the present invention provides a laser dazzling apparatus. The laser dazzling device capable of providing a non-lethal deterrent, warning, or halting effect on a human subject or group of human subjects. According to another embodiment, the present invention provides a laser pointing device. The laser pointer device is capable of accurately pointing at a target or alerting the target by applying a laser beam directly on the subject. In an alternate embodiment the present invention provides a laser sighting or aiming device. The laser aiming device capable of accurately aiming a weapon at a subject such that if the weapon is activated the subject will be struck. The laser device comprises at least a gallium and nitrogen containing device having an active region and a cavity member. The laser device is configured to emit a laser beam having a green wavelength of about 500 nm to 540 nm or a blue wavelength of about 420 nm to 485 nm. The active region includes a gallium and nitrogen containing material, the laser beam being characterized by a first direction. The laser device includes a driving circuit electrically coupled to the laser device. The driving circuit is adapted to deliver electrical energy to the laser device. The electrical energy is less than 800 mW. The laser device includes a power source electrically coupled to the driving circuit. The laser device includes an activation module electrically coupled to the driving circuit. The activation module can be configured to send an activation signal to the driving circuit. The laser device includes a sight for aligning the laser beam to a desired position.

The housing member 101 provides an enclosure for the components of the laser dazzling device. Depending on the specific application, the housing member 101 may be in various types of shapes. For example, the housing member 101 can be shaped like a pistol and includes a pistol grip. Alternative, the housing member 101 can be shaped like a rifle and comprises a rifle stock. Additionally, the housing member can be attached to vehicle mount and/or include tripod.

The laser device 103 according to embodiments of the present invention include one or more laser diodes that directly emit green laser beam without using frequency alteration (e.g., frequency double or DPSS) techniques. In a specific embodiment, the laser device includes a green laser diode that includes an active region and a cavity member. The green laser diode can be configured to emit a laser beam having a wavelength about 500 nm to 540 nm. In a specific embodiment, the wavelength is about 532 nm. The active region of the green laser diode includes gallium nitride material. For example, the green laser diode includes a mirror surface where the laser beam is emitted, and the laser beam is characterized by a first direction. Depending on the application, the green laser diode can be associated with one or more operational modes. For example, each of the operational modes is associated with a operating frequency.

In one embodiment, the laser device 103 comprises a plurality of green laser diodes sharing a single substrate. For example, the green laser diodes are monolithically integrated during the manufacturing process of the green laser diode, as is described below. By using a plurality of green laser diodes, the power level of the laser dazzling device can be increased. For example, a high power laser device having a plurality of green laser diodes is used for high-power military laser dazzling systems wherein the laser beams are used to disable weapons sensors. Alternatively, the laser device 103 comprises a plurality of green laser diodes sharing a single package.

According to various embodiments of the present invention, the green laser diode can be polar, semi-polar, or non-polar. For example, green laser diodes are fabricated from a bulk substrate. Since the green laser diodes directly emit laser beam in green wavelength range, the laser dazzling device is free from a frequency doubling crystal.

In many instances, the output power level of laser dazzling device needs to be limited to avoid permanent injury to eyes. In a specific embodiment, the laser beam is characterized by an energy level of less than 500 mW.

The driving circuit 104 is electrically coupled to the laser device 103. Among other things, the driving circuit 104 is specifically adapted to deliver electrical energy to the laser device. For example, the electrical energy can be less than 800 mW. The driving circuit 104 may deliver electrically energy to the laser device 103 in various ways. In one embodiment, the driving circuit is adapted to deliver electrical energy to the laser device in pulses.

The power source 105 is electrically coupled to the driving circuit. For example, the power source comprises a battery. The battery may be rechargeable or disposable. For example, NiMH or LiON rechargeable battery can be used for the power source.

The activation module 106 is electrically coupled to the driving circuit. The activation module is configured to send an activation signal to the driving circuit. For example, an operator is able to cause the driving circuit to provide electrical energy to the laser device, which in response emit a laser beam. In one embodiment, the activation module can be configured like a traditional trigger unit, which includes a trigger and a safety.

The sight 102 is provided for aligning the laser beam to a desired position. Depending on the application, the sight can be an open sight, an aperture sight, a red dot sight, a hologram sight, and/or a scope.

The optical member 107 is used to focus the laser beam. In an embodiment, the optical member 107 is positioned within vicinity the emitting portion of the laser device. For example, the optical member 107 includes collimation lens and telescope to collimate and size the laser beam. In one embodiment, the optical member 107 includes an optical concentrator aligned with the laser device. In another embodiment, the optical member comprises waveguide for projecting the laser beam along the first direction.

Figure 1A:
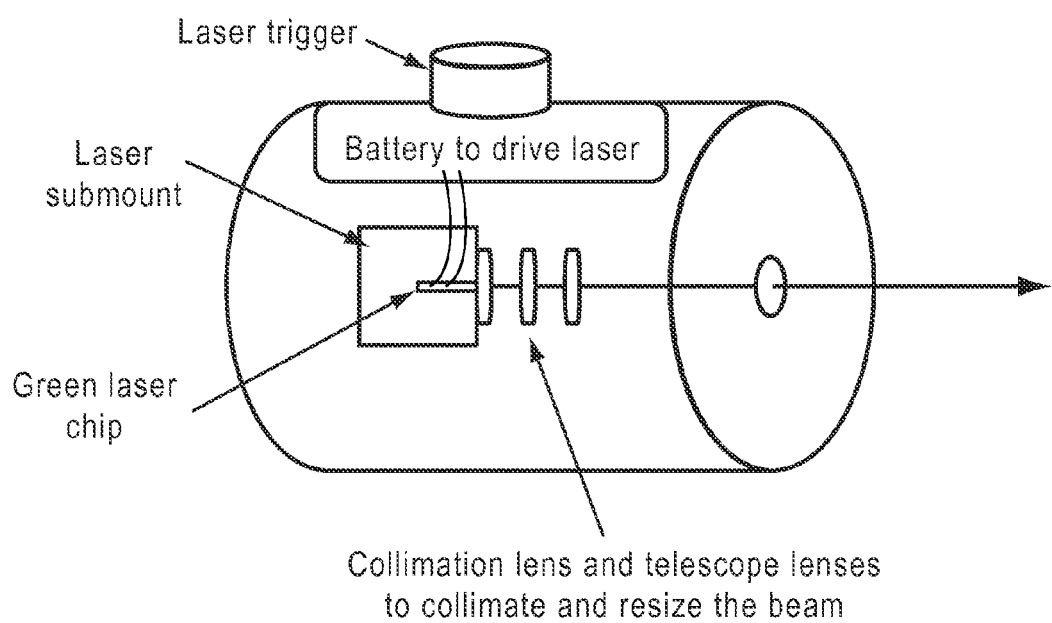
FIG. 1A is a simplified diagram illustrating an alternative laser dazzling device according to an embodiment of the present invention.

As mentioned above, various components of the laser dazzling device 100 may be added, removed, modified, and/or replaced. FIG. 1A is a simplified diagram illustrating an alternative laser device according to an embodiment of the present invention. FIG. 1A shows a laser trigger functionally coupled to a battery for driving the laser, a green laser chip mounted on a laser submount, and optics including collimation lenses and telescoping lenses for collimating and sizing the laser beam.

Figure 2A:
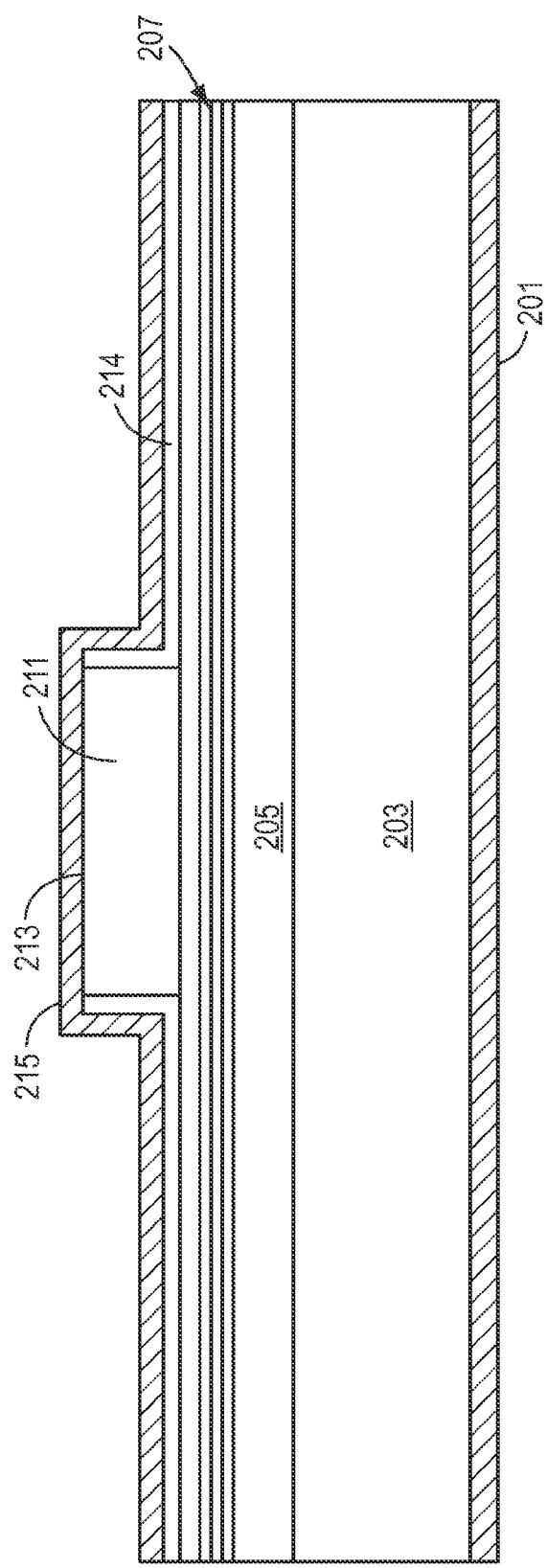
FIG. 2A is a detailed cross-sectional view of a laser device 200 fabricated on a {20-21} substrate according to an embodiment of the present invention.

As mentioned above, the laser devices according to the present invention utilizes green laser diodes. FIG. 2A is a detailed cross-sectional view of a laser device 200 fabricated on a {20-21} substrate according to an embodiment of the present invention. As shown, the laser device includes gallium nitride substrate 203, which has an underlying n-type metal back contact region 201. In a specific embodiment, the metal back contact region is made of a suitable material such as those noted below and others. Further details of the contact region can be found throughout the present specification and more particularly below.

In a specific embodiment, the device also has an overlying n-type gallium nitride layer 205, an active region 207, and an overlying p-type gallium nitride layer structured as a laser stripe region 211. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments, the high quality layer is doped, for example, with Si or O to form n-type material, with a dopant concentration between about $10^{16}$ cm$^{-3}$ and $10^{20}$ cm$^{-3}$.

In a specific embodiment, an n-type $Al_uIn_vGa_{1-u-v}N$ layer, where 0≤u, v, u+v≤1, is deposited on the substrate. In a specific embodiment, the carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE). Of course, there can be other variations, modifications, and alternatives.

As an example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. In certain embodiments, the susceptor can be heated to approximately 1100 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In a specific embodiment, the laser stripe region is made of the p-type gallium nitride layer 211. In a specific embodiment, the laser stripe is provided by an etching process selected from dry etching or wet etching. In a preferred embodiment, the etching process is dry, but can be others. As an example, the dry etching process is an inductively coupled process using chlorine bearing species or a reactive ion etching process using similar chemistries. Again as an example, the chlorine bearing species are commonly derived from chlorine gas or the like. The device also has an overlying dielectric region 214, which exposes contact region 213. In a specific embodiment, the dielectric region is an oxide such as silicon dioxide or silicon nitride, but can be others. The contact region is coupled to an overlying metal layer 215. The overlying metal layer is a multilayered structure containing gold and platinum (Pt/Au), nickel gold (Ni/Au), but can be others such as Pd/Au or Pd/Ti/Au. Of course, there can be other variations, modifications, and alternatives.

In a specific embodiment, the laser device has active region 207. The active region can include one to twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may be comprised of multiple quantum wells, with 2-10 quantum wells. The quantum wells may be comprised of InGaN with GaN barrier layers separating them. In other embodiments, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 20 nm. The composition and structure of the active layer are chosen to provide light emission at a preselected wavelength. The active layer may be left undoped (or unintentionally doped) or may be doped n-type or p-type. Of course, there can be other variations, modifications, and alternatives.

In a specific embodiment, the active region can also include an electron blocking region, and a separate confinement heterostructure. In some embodiments, an electron blocking layer is preferably deposited. The electron-blocking layer may comprise $Al_sIn_tGa_{1-s-t}N$, where 0≤s, t, s+t≤1, with a higher bandgap than the active layer, and may be doped p-type. In one specific embodiment, the electron blocking layer comprises AlGaN. In another embodiment, the electron blocking layer comprises an AlGaN/GaN super-lattice structure, comprising alternating layers of AlGaN and GaN, each with a thickness between about 0.2 nm and about 5 nm. In Of course, there can be other variations, modifications, and alternatives.

As noted, the p-type gallium and nitrogen containing structure is deposited above the electron blocking layer and active layer(s). The p-type layer may be doped with Mg, to a level between about $10^{16}$ cm$^{-3}$ and $10^{22}$ cm$^{-3}$, and may have a thickness between about 5 nm and about 1000 nm. The outermost 1-50 nm of the p-type layer may be doped more heavily than the rest of the layer, so as to enable an improved electrical contact. In a specific embodiment, the laser stripe is provided by an etching process selected from dry etching or wet etching. In a preferred embodiment, the etching process is dry, but can be others. The device also has an overlying dielectric region, which exposes 213 contact region. In a specific embodiment, the dielectric region is an oxide such as silicon dioxide, but can be others. Of course, there can be other variations, modifications, and alternatives.

According to an embodiment, the as-grown material gain peak is varied spatially across a wafer. As a result, different wavelength and/or color can be obtained from one fabricated laser to the next laser on the same wafer. The as-grown gain peak wavelength can be shifted using various methods according to embodiments of the present invention. According to one embodiment, the present invention utilizes growth non-uniformities where the as-grown material has an emission wavelength gradient. For example, the growth non-uniformity can be obtained a result of temperature and/or growth rate gradients in the light emitting layers in the epitaxial growth chamber. For example, such wavelength gradients can be intentional or non-intentional, and the differences in wavelengths range from 10 nm to 40 nm deviation. For example, this method enables multiple lasers on the same chip to operate at different wavelengths.

In a specific embodiment, an optical device configured to provide laser beams at different wavelengths is provided. The device includes a gallium and nitrogen containing substrate including a first crystalline surface region orientation. For example, the substrate member may have a surface region on the polar plane (c-plane), nonpolar plane (m-plane, a-plane), and semipolar plain ({11-22}, {10-1-1}, {20-21}, {30-31}, {30-32}, {20-2-1}, {30-3-1}, {30-3-2}). The device also includes an active region comprising a barrier layer and a light emission layer, the light emission layer being characterized by a graduated profile associated with a peak emission wavelength gradient, the peak emission wavelength gradient having a deviation of at least 10 nm. Also, the device includes a first cavity member overlying a first portion of the emission layer, the first portion of the emission layer being associated with a first wavelength, the first cavity member being characterized by a length of at least 100 µm and a width of at least 0.5 µm, the first cavity member being adapted to emit a first laser beam at the first wavelength. The device further includes a second cavity member overlying a second portion of the emission layer, the second portion of the emission layer being associated with a second wavelength, a difference between the first and second wavelengths being at least 50 nm, the second cavity member being characterized by a length of at least 100 µm and a width of at least 0.5 µm, the second cavity member being adapted to emit a second laser beam at a second wavelength. Additionally, the device includes an output region wherein the first laser beam and the second laser beam are combined.

Figure 2B:
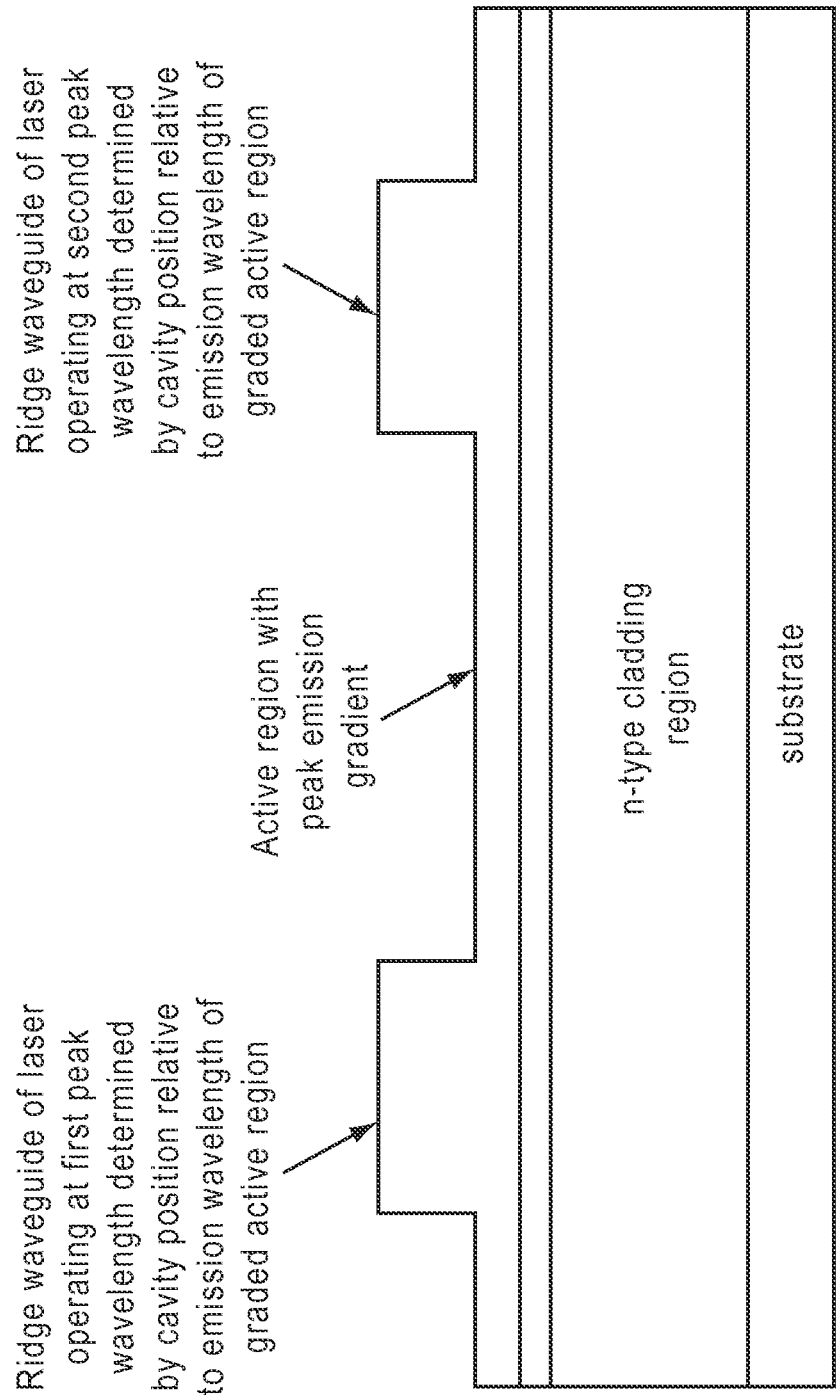
FIG. 2B is a simplified diagram illustrating a cross-section of an active region with graded emission wavelength.

As mentioned above, a laser dazzling device may include multiple green laser diodes for various purposes, such as increased power level, varying wavelength, and others. FIG. 2B is a simplified diagram illustrating a cross-section of an active region with graded emission wavelength. FIG. 2B shows a substrate, an n-type cladding region overlying the substrate, an active region characterized by a peak emission gradient overlying the n-type cladding region, and two ridge waveguide lasers overlying the active region. Each of the ridge waveguide lasers operates at a peak wavelength determined by the cavity position relative to the emission wavelength of the graded active region.

In certain embodiments of the present invention, emission at multiple laser wavelengths is obtained by manipulating the as-grown gain peak by selective area epitaxy (SAE), where dielectric patterns are used to define the growth area and modify the composition of the light emitting layers. Such modification of the composition can be used to cause different gain peak wavelengths and hence different lasing wavelengths. For example, by using SAE processes, a device designer can have a high degree of spatial control and can safely achieve 10 nm to 30 nm, and sometimes even more, of wavelength variation over the laser emission. For example, the SAE process is described in a U.S. Application Publication No. 2009/0309110. For example, this method enables multiple lasers on the same chip to operate at different wavelengths.

In certain embodiments, a laser dazzling apparatus manufactured using SAE processes with multiple wavelengths and/or colors is provided. The laser dazzling apparatus may include a gallium and nitrogen containing substrate characterized by a first crystalline surface region orientation. The apparatus also may include an active region comprising a barrier layer and a plurality of light emission layers, the plurality of light emission layers including at least a first emission layer and a second emission layer, the first emission layer being characterized by a first wavelength, the second emission layer being characterized by a second wavelength, a difference between the first wavelength and the second wavelength is at least 10 nm, at least 20 nm, and in certain embodiments, at least 30 nm. For example, the first and second emission layers can be formed using selective area epitaxy processes.

A laser dazzling apparatus may include a first cavity member overlying the first emission layer, the first cavity member being characterized by a length of at least 100 µm and a width of at least 0.5 µm, the first cavity member being configured to emit a first laser beam at a first wavelength. The apparatus may also include a second cavity member overlying the second the emission layer, the second cavity member being characterized by a length of at least 100 µm and a width of at least 0.5 µm, the second cavity member being configured to emit a second laser beam at a second wavelength. The apparatus may additionally include an output region wherein the first laser beam and the second laser beam are combined, for example, using optics.

As explained above, it can be desirable to combine the first and second wavelengths or colors as suitable for various applications. For example, the apparatus may have optics having dichroic coatings for combining a first and the second laser beams. In one embodiment, the apparatus includes a plurality of polarizing optics for combining a first and the second laser beams. In certain embodiments, the first cavity member and the second cavity member share a common cleaved facet of mirror edges, which can be configured to combine the first and second laser beams. In certain embodiments in which the laser device emits more than two laser beams, the multiple laser beams can be combined into a single laser beam, some of the multiple laser beams may be combined into a common laser beams, and/or one or more of the laser beams may be directed toward a distant area. The multiple laser beams directed from the apparatus may be collimated or non-collimated to fill an area on a target at a distance from the laser dazzling apparatus.

The first and second laser beams can be associated with a number of color combinations. For example, the first wavelength can be associated with a green color and the second wavelength can be associated with a blue color. Alternatively, the first and second wavelengths may be associated with a different hue of the same color. In general, a blue wavelength refers to a wavelength from about 420 nm to about 500 nm, and a blue wavelength refers to a wavelength from about 500 nm to about 540 nm, It is to be appreciated that the laser devices can be implemented on various types of substrates. For example, the first crystalline surface region orientation can be a {0001} polar plane, a {20-21} semipolar plane, a {30-31} semipolar plane, the m-plane, or other planes of a gallium and nitrogen containing substrate.

A laser device may also include other structures, such as a surface ridge architecture, a buried heterostructure architecture, and/or a plurality of metal electrodes for selectively exciting the active region. For example, the active region may comprise first and second gallium and nitrogen containing cladding layers and an indium and gallium containing emitting layer positioned between the first and second cladding layers. A laser device may further include an n-type gallium and nitrogen containing material and an n-type cladding material overlying the n-type gallium and nitrogen containing material.

In certain embodiments of the present invention, multiple laser wavelengths and/or colors are obtained by providing multiple active regions, where certain of the active regions is associated with a specific wavelength (or color). More specifically, multiple growth of active regions can be performed across a single chip. In this technique a wafer is loaded in a growth chamber for the growth of an active region with one gain peak. After this growth, the wafer is subjected to one or more lithography and processing steps to remove a portion of the active region in some areas of the wafer. The wafer can then be subjected to a second growth process where a second active region with a second peak gain wavelength is grown. Depending on the specific need, the processes of growing and removing active regions can be repeated many times. Eventually, this can be followed by the fabrication of laser diodes strategically positioned relative to these different active regions to enable lasing at various wavelengths.

Figure 2C:
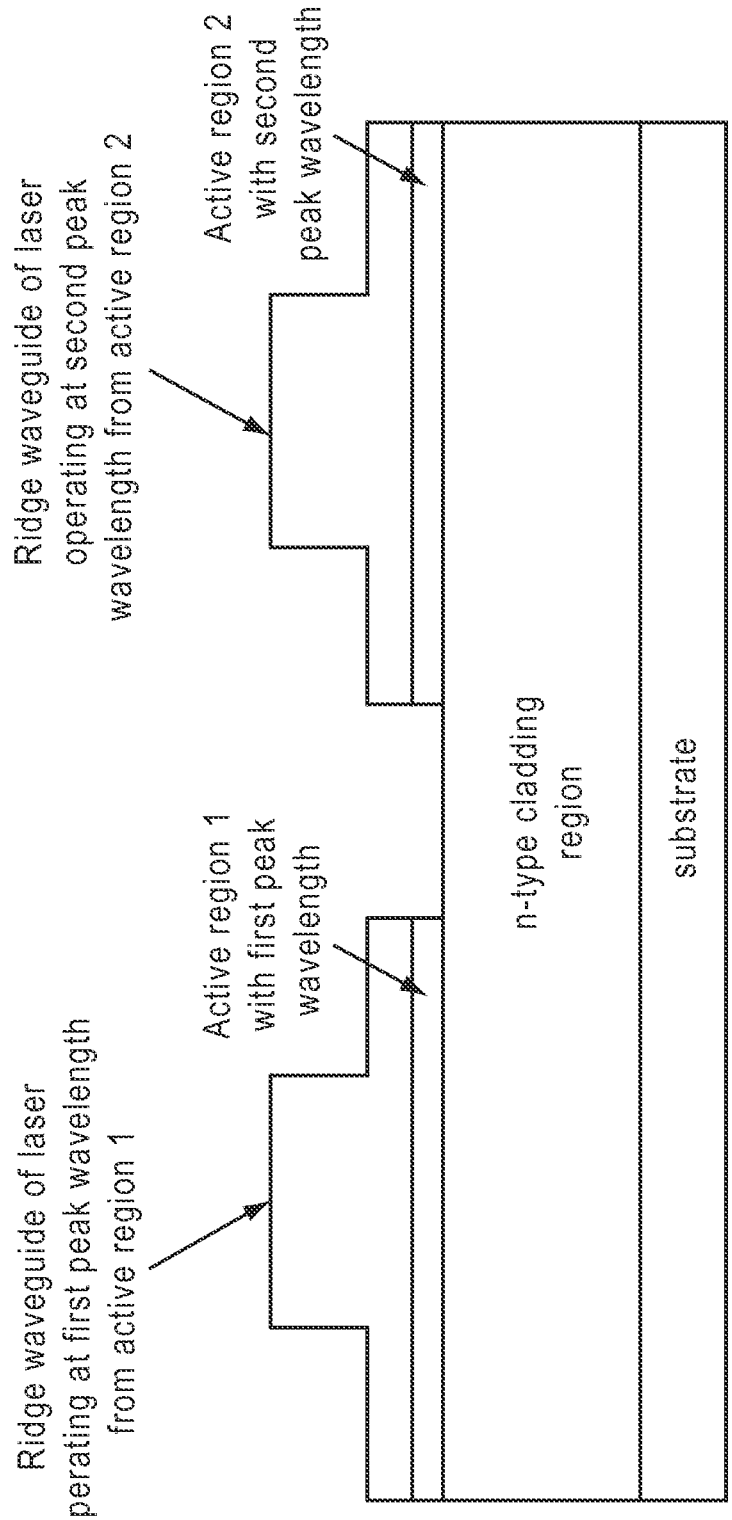
FIG. 2C is a simplified diagram illustrating a laser device with multiple active regions according to embodiments of the present invention.

FIG. 2C is a simplified diagram illustrating a laser device with multiple active regions according to certain embodiments. As an example, each active region can be used to emit a green laser beam. FIG. 2C shows a substrate, an n-type cladding region overlying the substrate, active region 1 with a first peak wavelength overlying a first portion of the n-type cladding region, active region 2 with a second peak wavelength overlying a second portion of the n-type cladding region, and ridge waveguide structures overlying each of the active regions. The ridge waveguide overlying active region 1 operates at a first peak emission wavelength characteristic of active region 1, and the ridge waveguide overlying active region 2 operates at a second peak emission wavelength characteristic of active region 2.

According to certain embodiments, the following steps can be performed in a method for forming a device that includes laser devices having multiple active regions:

1. providing a gallium and nitrogen containing substrate including a first crystalline surface region orientation;
2. defining a first active region by performing a selective etching process;
3. forming a barrier layer within the first active region;
4. growing a first emission layer within the first active region, the first emission layer being configured to emit a first wavelength;
5. defining a second active region by performing a selective etching process;
6. growing a second emission layer within the second active area, the second emission layer being configured to emit a second wavelength, a difference between the first gain peak wavelength and the second gain peak wavelength being at least 10 nm;
7. forming a first cavity member overlying the first emission layer, the first cavity member being characterized by a length of at least 100 µm and a width of at least 0.5 µm, the first cavity member being configured to emit a first laser beam at the first wavelength;
8. forming a second cavity member overlying the second the emission layer, the second cavity member being characterized by a length of at least 100 µm and a width of at least 0.5 µm the second cavity member being configured to emit a second laser beam at the second wavelength; and
9. aligning the first and second cavity members to combine the first and second laser beams at a predetermine region.

Depending on the application, the above method may also include other steps. For example, the method may include providing an optical member for combining the first and second laser beams. In one embodiment, the method includes shaping a first cleaved surface of the first cavity member, shaping a second cleaved surface of the second cavity member, and aligning the first and second cleaved surfaces to cause the first and second laser beams to combine.

It is to be appreciated that the method described above can be implemented using various types of substrates. As explained above, the substrate member may have a surface region on the polar {0001} plane (c-plane), nonpolar plane (m-plane, a-plane), and semipolar plain ({11-22}, {10-1-1}, {20-21}, {30-31}). In the method described above, two active regions and two cavity members are formed. For example, each active region and cavity member pair is associated with a specific wavelength. Depending on the application, additional active regions and cavity members may be formed to obtain desired wavelengths and/or spectral widths. In a certain embodiments, each of the active regions is characterized by a specific spatial dimension associated with a specific wavelength.

In certain embodiments, a laser apparatus having multiple active regions that provide multiple wavelengths and/or colors is provided. The laser apparatus includes a gallium and nitrogen containing substrate including a first crystalline surface region orientation. In certain embodiments, a substrate comprises an Indium bearing material. An apparatus also may include a first active region comprising a barrier layer and a first emission layer, the first emission layer being characterized by a first gain peak wavelength. An apparatus may include a second active region comprising a second emission layer, the second emission layer being characterized by a second gain peak wavelength, a difference between the first gain peak wavelength and the second gain peak wavelength is at least 10 nm.

An apparatus may further include a first cavity member overlying the first emission layer, the first cavity member being characterized by a length of at least 100 µm and a width of at least 0.5 µm, the first cavity member being configured to emit a first laser beam at the first wavelength. The apparatus additionally includes a second cavity member overlying the second the emission layer, the second cavity member being characterized by a length of at least 100 µm and a width of at least 0.5 µm the second cavity member being configured to emit a second laser beam at the second wavelength. An apparatus may further include an output region wherein the first laser beam and the second laser beam are combined.

As explained above, it can be desirable to combine the first and second wavelengths or colors for various applications. For example, an apparatus may have optics having dichroic coatings for combining the first and the second laser beams. In certain embodiments, an apparatus includes a plurality of polarizing optics for combining the first and the second laser beams. In a certain embodiments, the first cavity member and the second cavity member share a common cleaved facet of mirror edges, which is configured to combine the first and second laser beams.

The first and second laser beams can be associated with a number of color combinations. For example, the first wavelength can be associated with a green color and the second wavelength can be associated with a blue color.

It is to be appreciated that the laser apparatus can be implemented on various types of substrates and surface orientations. For example, the first crystalline surface region orientation can be a {20-21} plane, and first crystalline surface region orientation can also be a {30-31} plane.

A laser apparatus may also include other structures, such as a surface ridge architecture, a buried heterostructure architecture, and/or a plurality of metal electrodes for selectively exciting the active region. For example, an active region may comprise a first and second gallium and nitrogen containing cladding layers and an indium and gallium containing emitting layer positioned between the first and second cladding layers. A laser apparatus may further includes an n-type gallium and nitrogen containing material and an n-type cladding material overlying the n-type gallium and nitrogen containing material.

It is to be appreciated that embodiments of the present invention provide methods for obtaining multiple laser wavelengths and/or colors after the active regions have already been formed. More specifically, the gain-peak of the semiconductor material can be spatially manipulated post-growth using quantum well intermixing (QWI) processes and/or disordering of the light emitting layers. A QWI process makes use of the metastable nature of the compositional gradient found at heterointerfaces. The natural tendency for materials to interdiffuse is the basis for the intermixing process. Because the lower energy light emitting quantum well layers are surrounded by higher energy barriers of a different material composition, the interdiffusion of the well-barrier constituent atoms can result in higher energy light emitting layers and therefore a blue-shifted (or shorter) gain peak.

The rate at which this process takes place can be enhanced with the introduction of a catalyst. Using a lithographically definable catalyst patterning process, the QWI process can be made selective. This is the process by which many selective QWIs are formed, whether by the introduction of impurities or by the creation of vacancies. There are many techniques that have evolved over the years to accomplish selective intermixing, such as impurity-induced disordering (IID), impurity-free vacancy-enhanced disordering (IFVD), photoabsorption-induced disordering (PAID), and implantation-enhanced interdiffusion to name just a few. Such methods are capable of shifting the peak gain wavelengths by 1 nm to over 100 nm. By employing one of these or other QWI methods to detune the gain peak of adjacent laser devices, the combined lasing spectrum of the side-by-side devices can be altered.

In certain embodiments, a laser apparatus capable of multiple wavelength can be manufactured by using QWI processes described above. The apparatus may include a gallium and nitrogen containing substrate including a first crystalline surface region orientation. The apparatus also may include an active region comprising a barrier layer and a plurality of light emission layers, the plurality of light emission layers including a first emission layer and a second emission layer, the barrier layer being characterized by a first energy level, the first emission layer being characterized by a first wavelength and a second energy level, the second energy level being lower than the first energy level, the first emission layer having a first amount of material diffused from the barrier layer, the second emission layer being characterized by a second wavelength, a difference between the first gain peak wavelength and the second gain peak wavelength being at least 1 nm. For example, the second emission layer has a second amount of material diffused from the barrier layer.

An apparatus also may include a first cavity member overlying the first emission layer, the first cavity member being characterized by a length of at least 100 µm and a width of at least 0.5 µm, the first cavity member being configured to emit a first laser beam at the first wavelength. An apparatus may include a second cavity member overlying the second the emission layer, the second cavity member being characterized by a length of at least 100 µm and a width of at least 0.5 µm the second cavity member being configured to emit a second laser beam at the second wavelength. An apparatus can includes an output region wherein the first laser beam and the second laser beam are combined.

Depending on the application, the active region may include various types of material, such as InP material, GaAs material, and others. An apparatus may have optics with dichroic coatings for combining the first and the second laser beam. In certain embodiments, an apparatus includes a plurality of polarizing optics for combining the first and the second laser beams. In a certain embodiments, the first cavity member and the second cavity member share a common cleaved facet of mirror edges, which can be configured to combine the first and second laser beams. The first and second laser beams can both green but at slightly different wavelengths.

It is to be appreciated that a laser apparatus can be implemented on various types of substrates. For example, the first crystalline surface region orientation can be a {20-21} plane, and first crystalline surface region orientation can also be a {30-31} plane. The laser apparatus may also include other structures, such as a surface ridge architecture, a buried heterostructure architecture, and/or a plurality of metal electrodes for selectively exciting the active region For example, the active region comprises a first and second gallium and nitrogen containing cladding layers and an indium and gallium containing emitting layer positioned between the first and second cladding layers. The laser apparatus may further includes an n-type gallium and nitrogen containing material and an n-type cladding material overlying the n-type gallium and nitrogen containing material.

In various embodiments, laser diodes formed on different substrates are packaged together. It is to be appreciated that by sharing packaging of laser diodes, it is possible to produce small devices suitable for certain applications (e.g., pico-projectors), as multiple laser diodes can tightly fit together. For example, light engines having laser diodes in multiple colors are typically capable of reducing the amount of speckle in display applications. In addition, co-packaged laser diodes are often cost-efficient, as typically fewer optics are needed to combined laser beams from laser diodes as a result of sharing packages.

Figure 3:
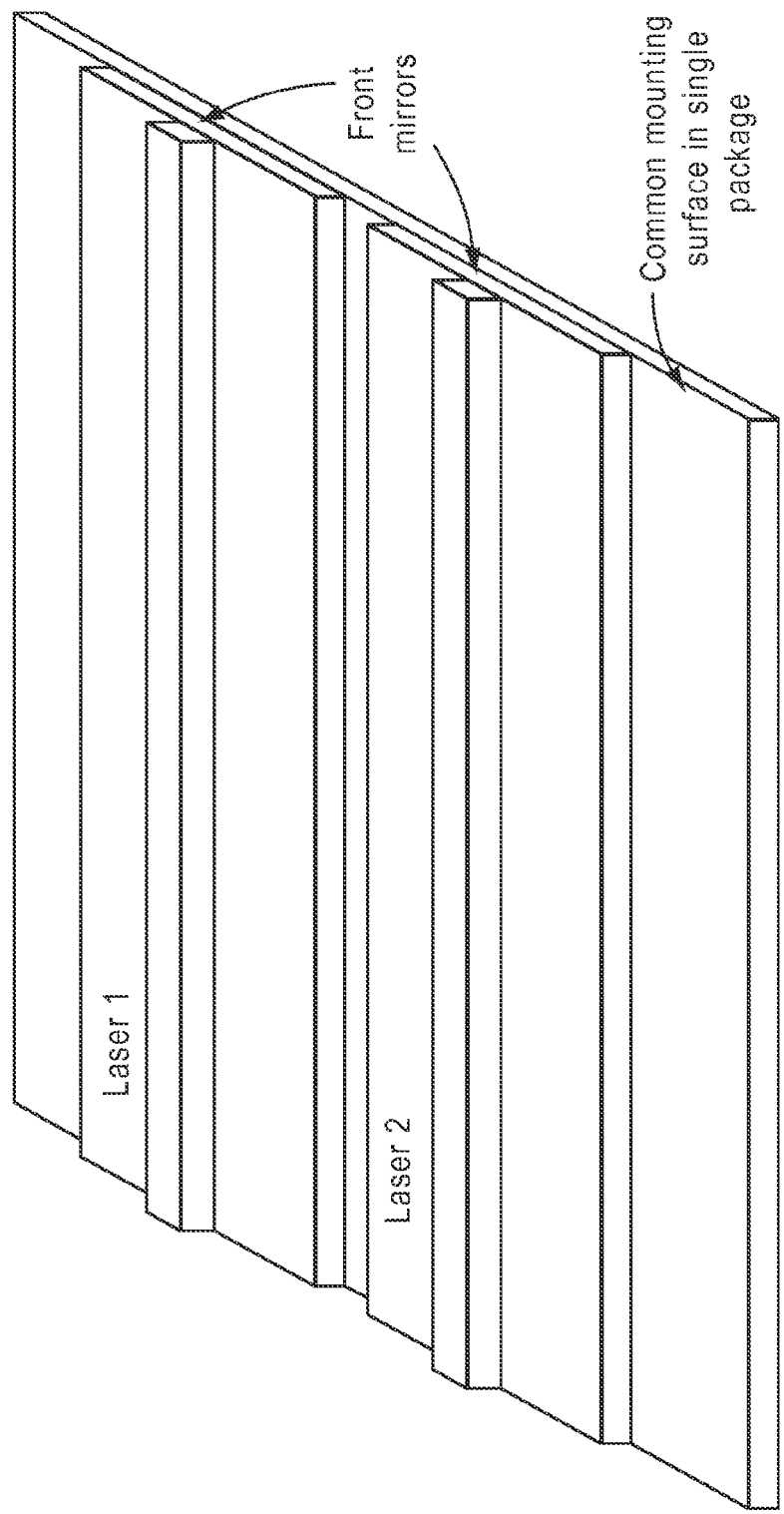
FIG. 3 is a simplified diagram of co-packaged laser diodes mounted on common surface within a single package.

FIG. 3 is a simplified diagram of co-packaged laser diodes mounted on a common surface within a single package. For example, both laser 1 and laser 2 can be green laser diodes, blue laser diodes, or a combination of green and blue laser diodes. By combining the output from both laser diodes, a combined laser beam with high power can be achieved.

The present invention combines laser devices such as the dazzler device, the laser pointer device, or the laser aiming device described above with another weapon or deterrent device to form a multi-stage weapon or deterrent device. The novel multi-stage weapon and/or deterrent device provides the user with various levels of force to apply to the subject. Such weaponry or deterrent stages can range from a simple laser pointer device incident on a subject such that a subject is alerted that he/she is identified for escalated force if they do not comply with orders, to laser a dazzling device capable of overloading a subject's senses and rendering them temporarily incapacitated, to application of pepper spray to the subject's eyes such that the subject is temporarily blinded, to projecting rubber bullets at the subject to physically bruise or knock down the subject, and finally to a fatal weapon such as a live firearm. By having multiple stages including multiple deterrent and weaponry options available to a user, the user can systematically escalate the force based on the circumstances with the goal of deterring, debilitating, or killing a subject based on the situation. Such a weapon can effectively prevent fatalities because the user will be able to systematically increase the force level of the non-lethal options prior to using lethal force.

In certain embodiments, a laser device is combined with a Taser device capable of applying an electroshock. The electroshock can be realized by injecting an electrical current into a subject, which disrupts voluntary control of muscles causing "neuromuscular incapacitation". In this embodiment, the laser device can be a dazzling device such that before a user engages the Taser the user will engage the less lethal dazzling device in effort to make the subject comply. If the subject does not comply with use of the dazzling device, the user would then engage the Taser device to expose the subject to a more severe electrical shock. In a variation of this embodiment, a chemical agent such as pepper spray or mace is used in place of or combined with the Taser device. The chemical agent would have a similar function as the Taser devices, which is to apply a more lethal impact to the subject relative to the dazzling device. An extension to this embodiment employs laser pointer devices to project a laser beam on the subject. By projecting the laser beam on the subject the subject can be made aware that more severe force will be used if he/she does not comply. The pointer device represents the lowest lethality. If the subject does not comply the user can engage the dazzling device. The dazzling device may comprise the same laser diodes forming the pointer device, but with the dazzling device operating at higher power. For example, the pointer device may operate between 5 mW and 25 mW and the dazzler device may operate between 25 mW and 800 mW. If the dazzling device is not effective in subduing the subject, the user could then apply the Taser or pepper spray device. In a further embodiment, a multi-stage weapon may comprise a firearm. In this embodiment, a user could apply lethal force to the non-compliant subject following application of the Taser and/or pepper spray.

The following embodiments A through E provide examples of multi-stage weapons containing laser diodes where the various stages are listed in order from the least lethal to the most lethal.

Embodiment A

Stage 1: Laser diode dazzler device (non-lethal deterrent/weapon)
Stage 2: Taser device (non-lethal deterrent/weapon)

Embodiment B

Stage 1: Laser diode dazzler device (non-lethal deterrent/weapon)
Stage 2: Pepper spray deploying device (non-lethal deterrent/weapon)

Embodiment C

Stage 1: Laser diode dazzler device (non-lethal deterrent/weapon)
Stage 2: Taser device (non-lethal deterrent/weapon)
Stage 3: Firearm device (lethal weapon)

Embodiment D

Stage 1: Laser diode pointer device (warning)
Stage 2: Laser diode dazzler device (non-lethal deterrent/weapon)
Stage 3: Taser device (non-lethal deterrent/weapon)
Stage 4: Firearm device (lethal weapon)

Embodiment E

Stage 1: Laser diode pointer device (warning)
Stage 2: Laser diode aiming device (improving accuracy of deterrent/weapons)
Stage 3: Laser diode dazzler device (non-lethal deterrent/weapon)
Stage 4: Taser device (non-lethal deterrent/weapon)
Stage 5: Firearm device (lethal weapon)

Figure 4:
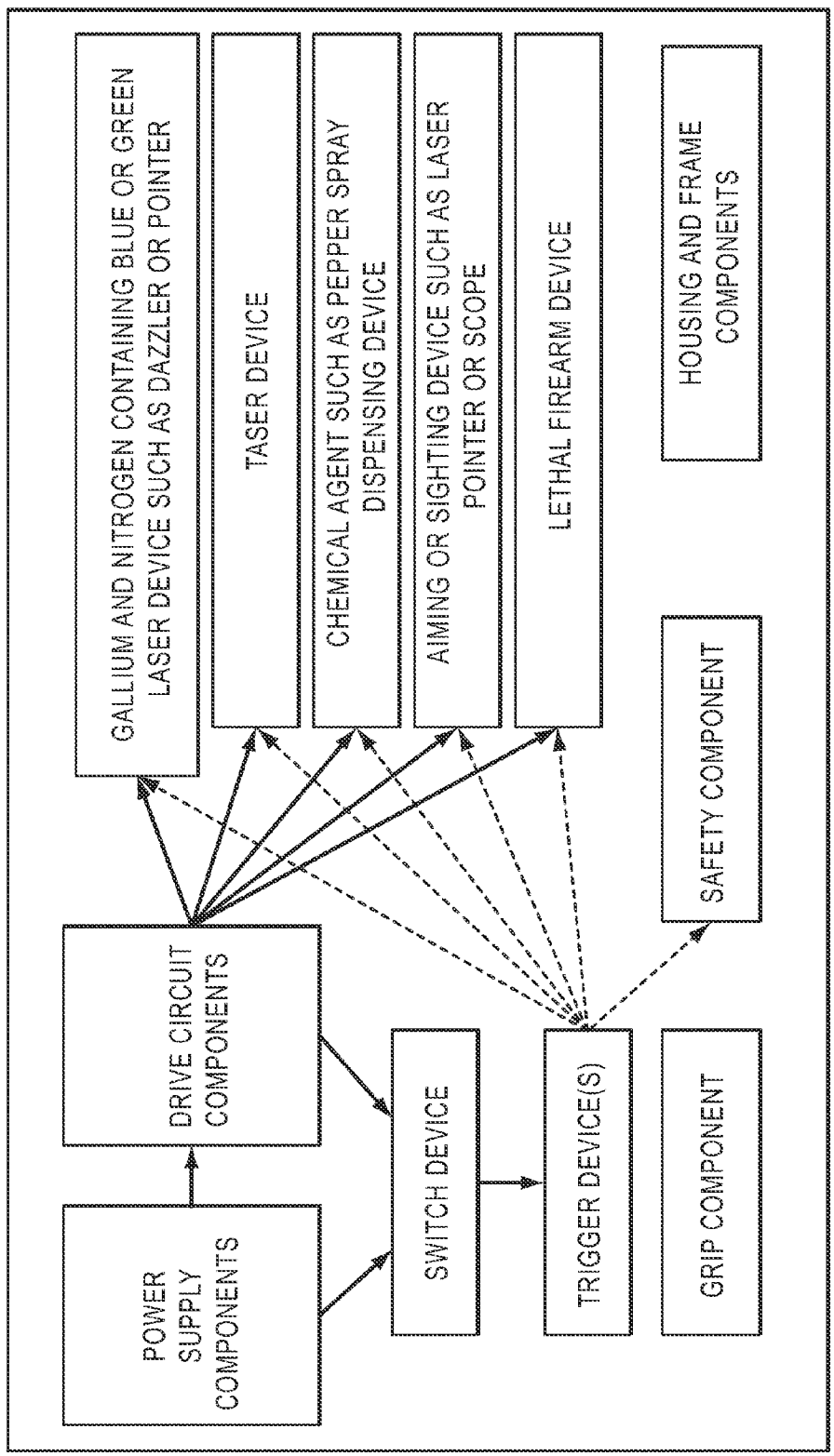
FIG. 4 shows an example system schematic of a multi-stage weapon according to certain embodiments.

FIG. 4 shows an example system schematic of a multi-stage weapon according to certain embodiments. The system schematic shown in FIG. 4 includes power supply components, drive circuit components, a switch device, and one or more trigger devices. The drive circuit components and one or more trigger devices is functionally coupled to a gallium and nitrogen containing blue or green laser device such as a dazzler or pointer; a Taser device, a chemical agent such as a pepper spray dispensing device, an aiming or sighting device such as a laser pointer or scope, and a lethal firearm device. The system further includes a grip component, a safety component, and housing and frame components.

Figure 5:
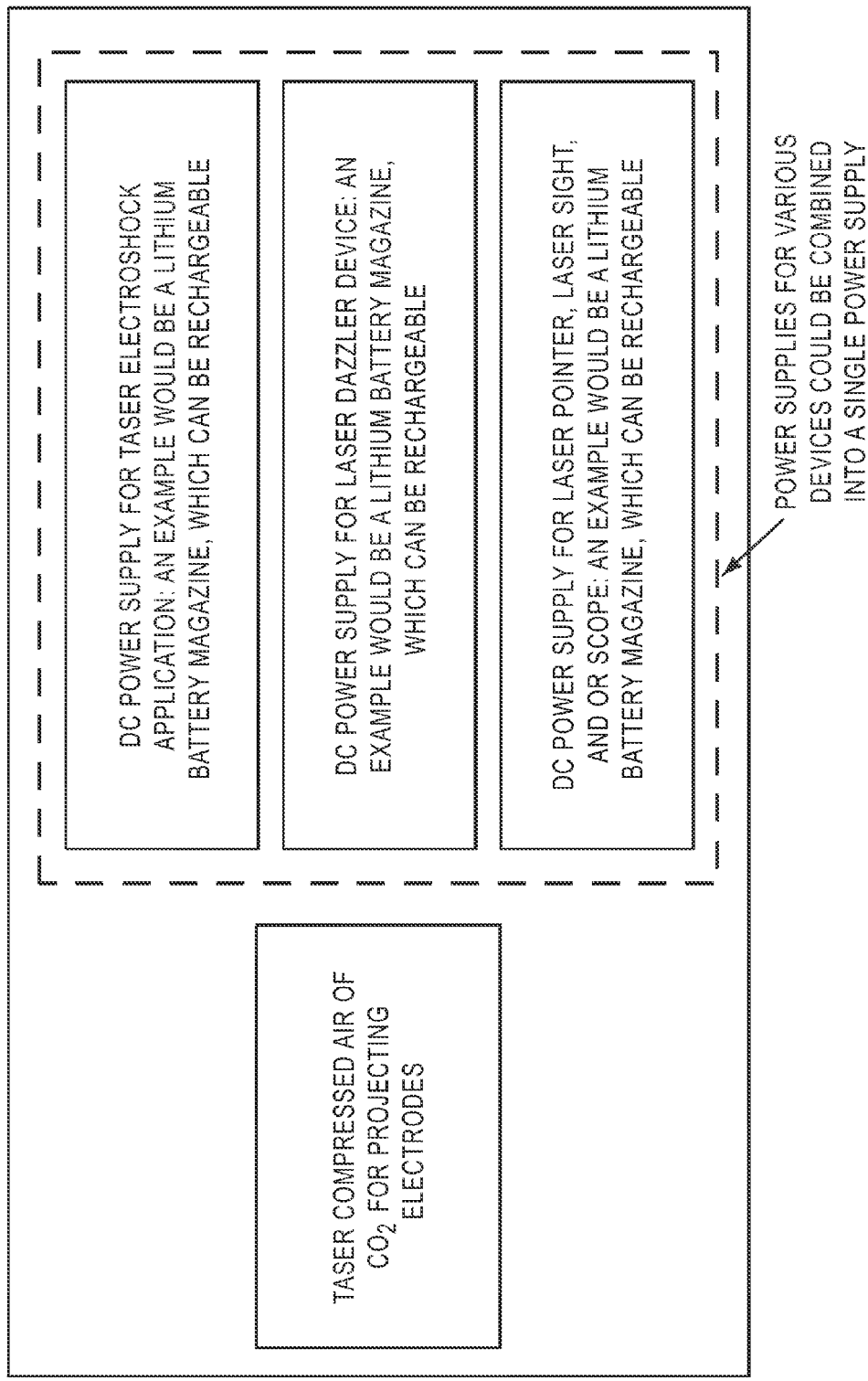
FIG. 5 shows an example schematic of power supply component according to certain embodiments.

FIG. 5 shows an example of a schematic of power supply components according to certain embodiments. The power supply schematic shown in FIG. 5 includes a DC power supply for Taser electroshock application; a DC power supply for a laser dazzler device; and a DC power supply for a laser pointer, a laser sight and/or a laser scope. Each of the DC power supplies may be a lithium battery magazine and can be rechargeable. The individual power supplies may also be combined into a single power supply. The power supply may also include compress air or $CO_2$ for projecting Taser electrodes.

Figure 6:
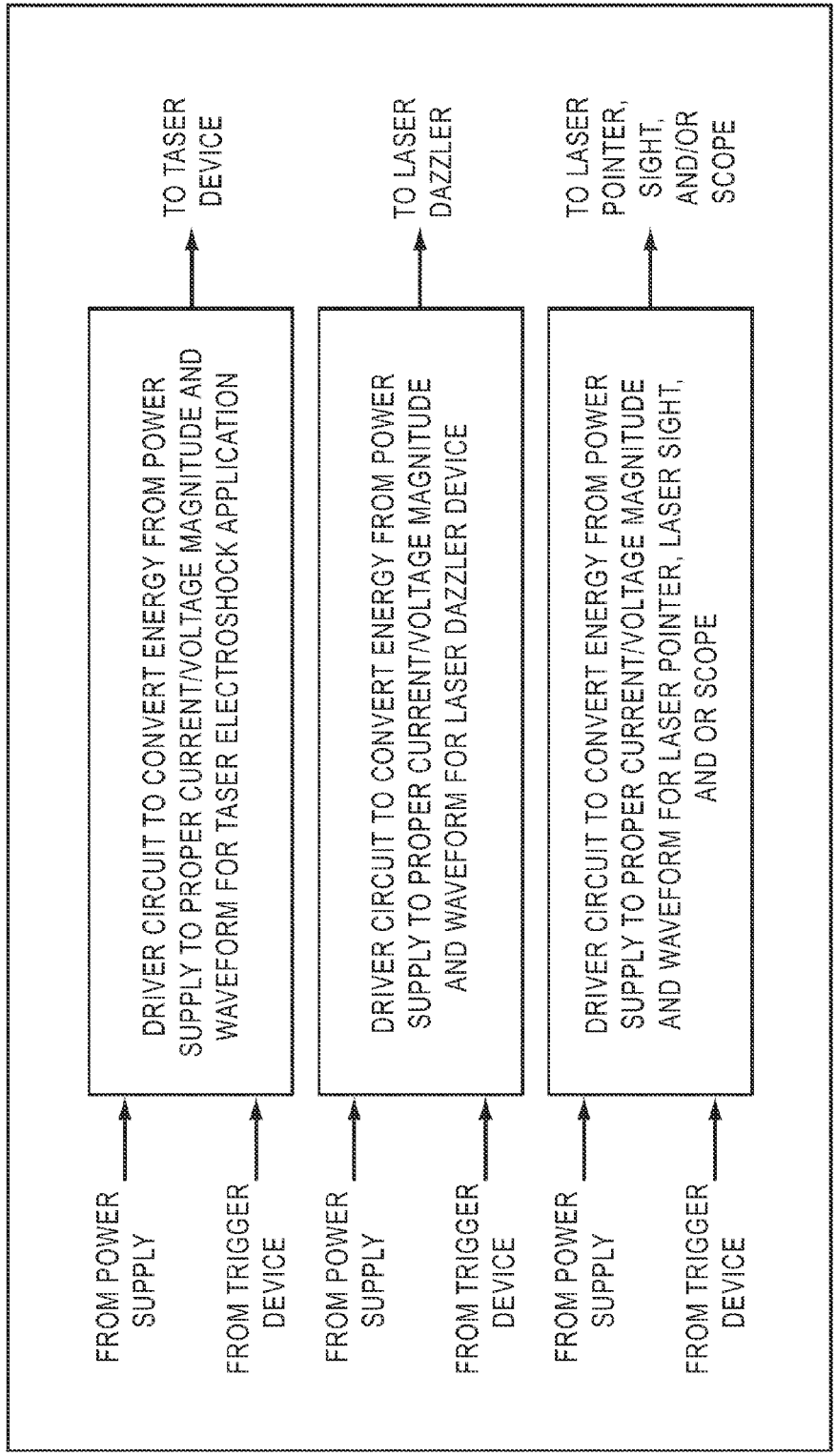
FIG. 6 shows an example schematic of driver circuitry components according to certain embodiments.

FIG. 6 shows an example schematic of driver circuitry components according to certain embodiments. The driver circuitry shown in FIG. 6 includes a driver circuit to convert energy from the power supply to a drive having a suitable current, voltage, and waveform for Taser electroshock applications; a driver circuit to convert energy from a power supply to a drive having suitable current, voltage, and waveform to drive a laser dazzler; and a driver circuit to convert energy from a power supply a drive having suitable current, voltage, and waveform to drive a laser pointer, laser sight, and/or a scope. Each of the drivers may be coupled to a trigger device.

Figure 7:
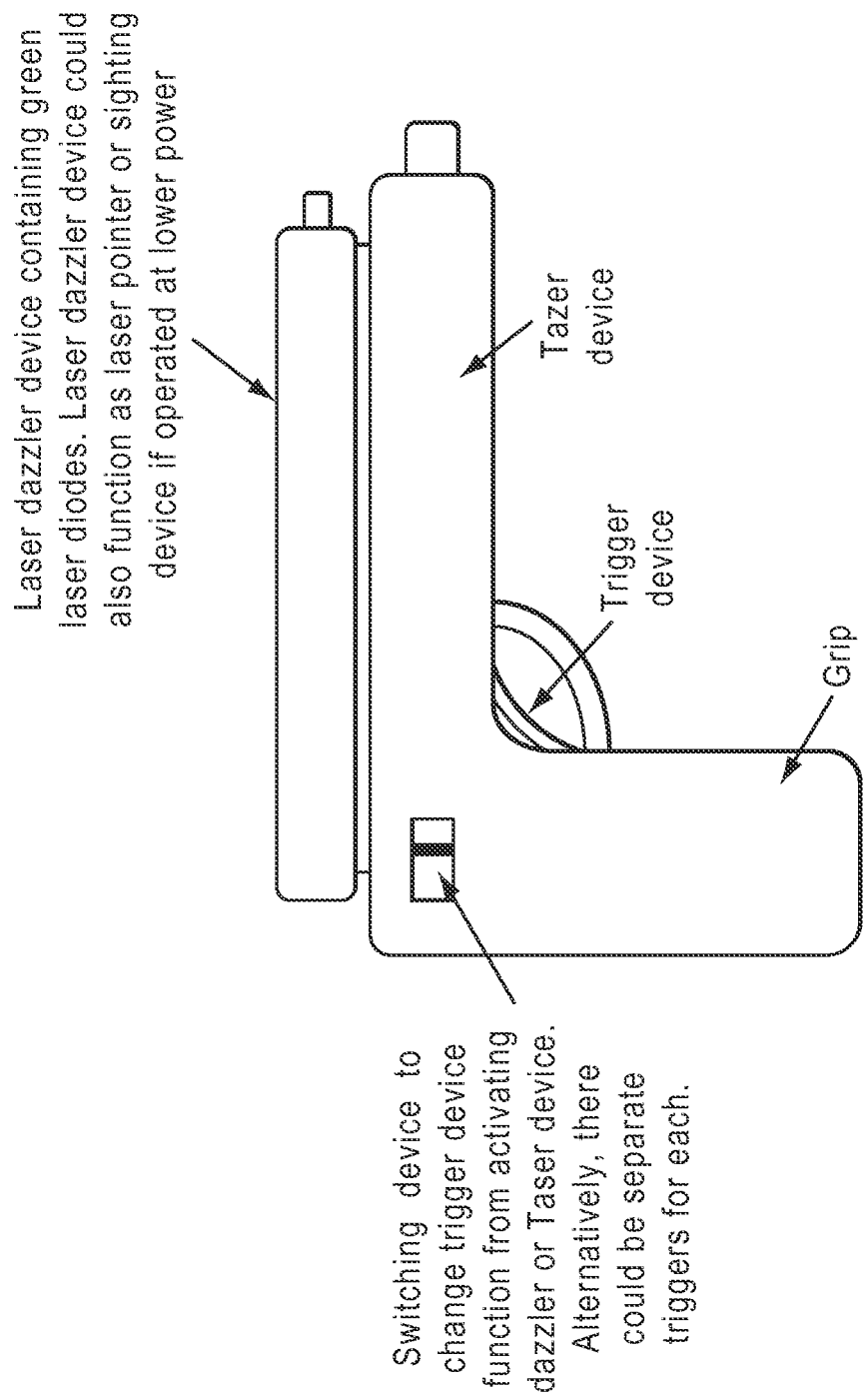
FIG. 7 shows an example of a multi-stage weapon according to certain embodiments according to certain embodiments.

FIG. 7 shows an example of a multi-stage weapon according to certain embodiments. The weapon shown in FIG. 7 includes a laser dazzler device comprising green laser diodes, a Taser device, a trigger device, a grip, and a switching device. The laser dazzler device can optionally function as a laser pointer or a sighting device. The switching device can change the trigger device from activating the dazzler, Taser, or firearm device. Optionally, there may be a separate trigger for each function.

Figure 8:
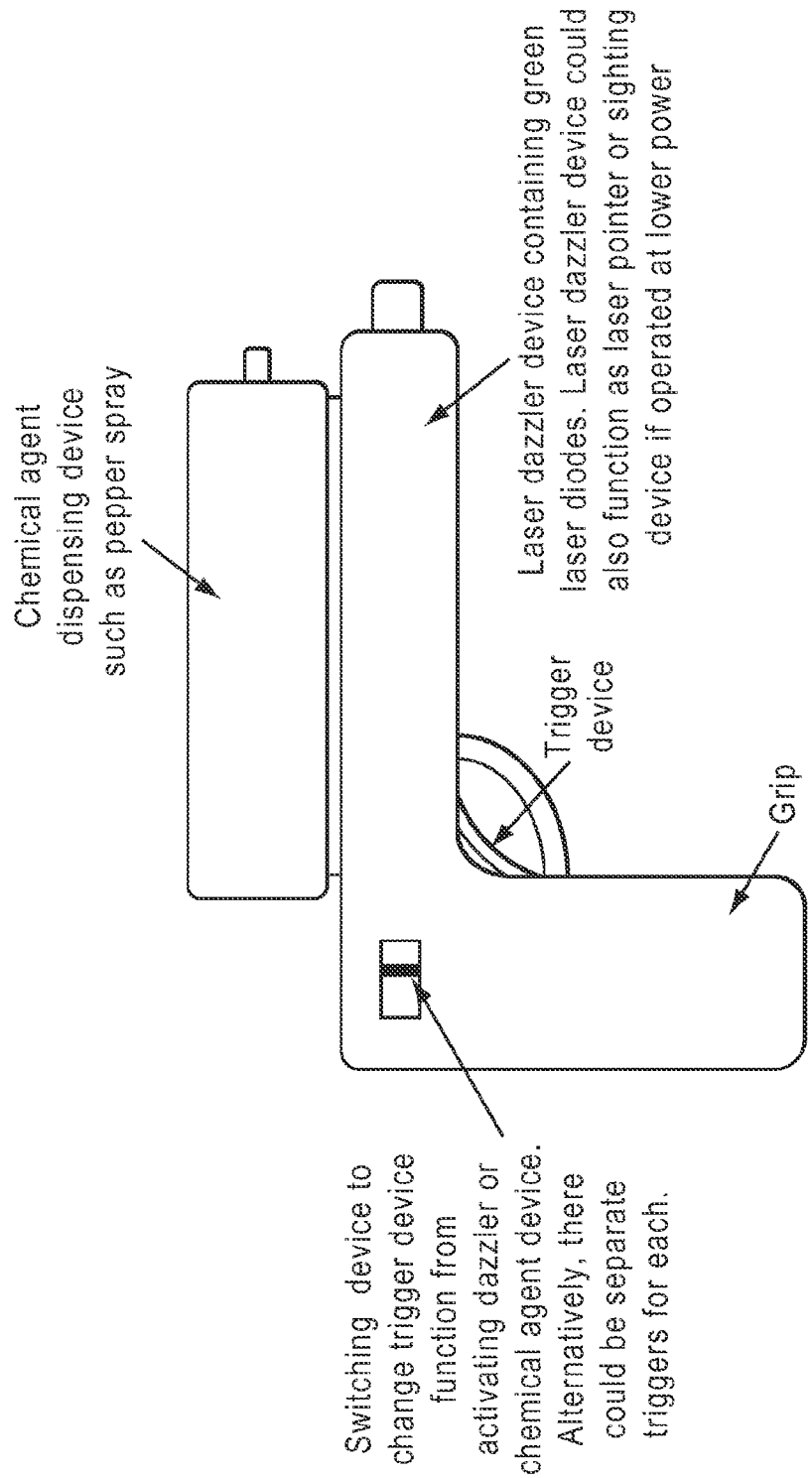
FIG. 8 shows an example of a multi-stage weapon according to certain embodiments.

FIG. 8 shows an example of a multi-stage weapon according to certain embodiments. The weapon shown in FIG. 8 includes a chemical agent dispensing device such as for dispensing pepper spray, a laser dazzler device comprising green laser diodes, a trigger device, a grip, and a switching device. The laser dazzler device can optionally function as a laser pointer or a sighting device. The switching device can change the trigger device from activating the dazzler, Taser, or firearm device. Optionally, there may be a separate trigger for each function.

Figure 9:
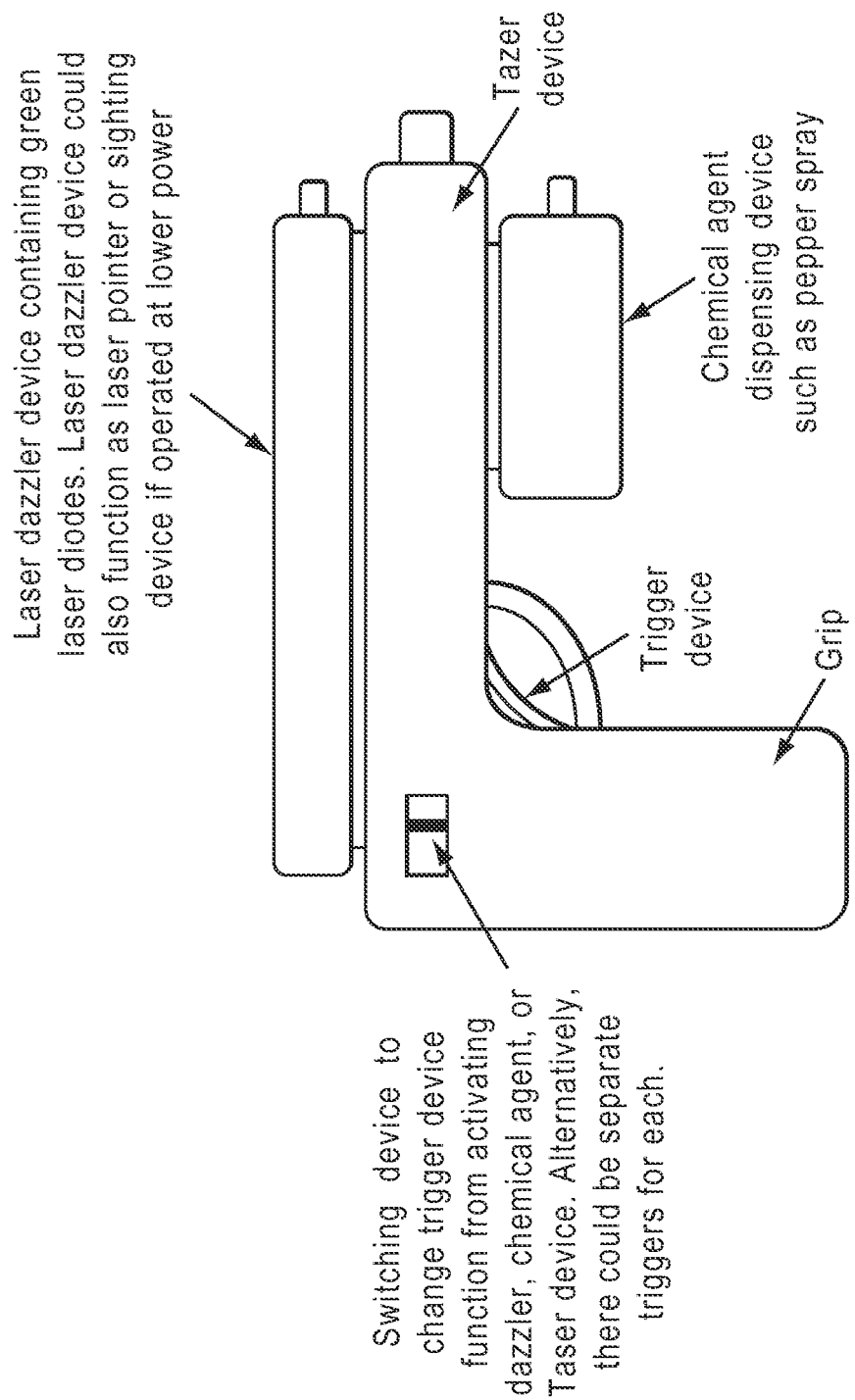
FIG. 9 shows an example of a multi-stage weapon according to certain embodiments.

FIG. 9 shows an example of a multi-stage weapon according to certain embodiments. The weapon shown in FIG. 9 includes a laser dazzler with green laser diodes, a Taser device, a chemical agent dispensing device such as for dispensing pepper spray, a trigger device, a grip, and a switching device. The laser dazzler device can optionally function as a laser pointer or a sighting device. The switching device can change the trigger device from activating the dazzler, Taser, or firearm device. Optionally, there may be a separate trigger for each function.

Figure 10:
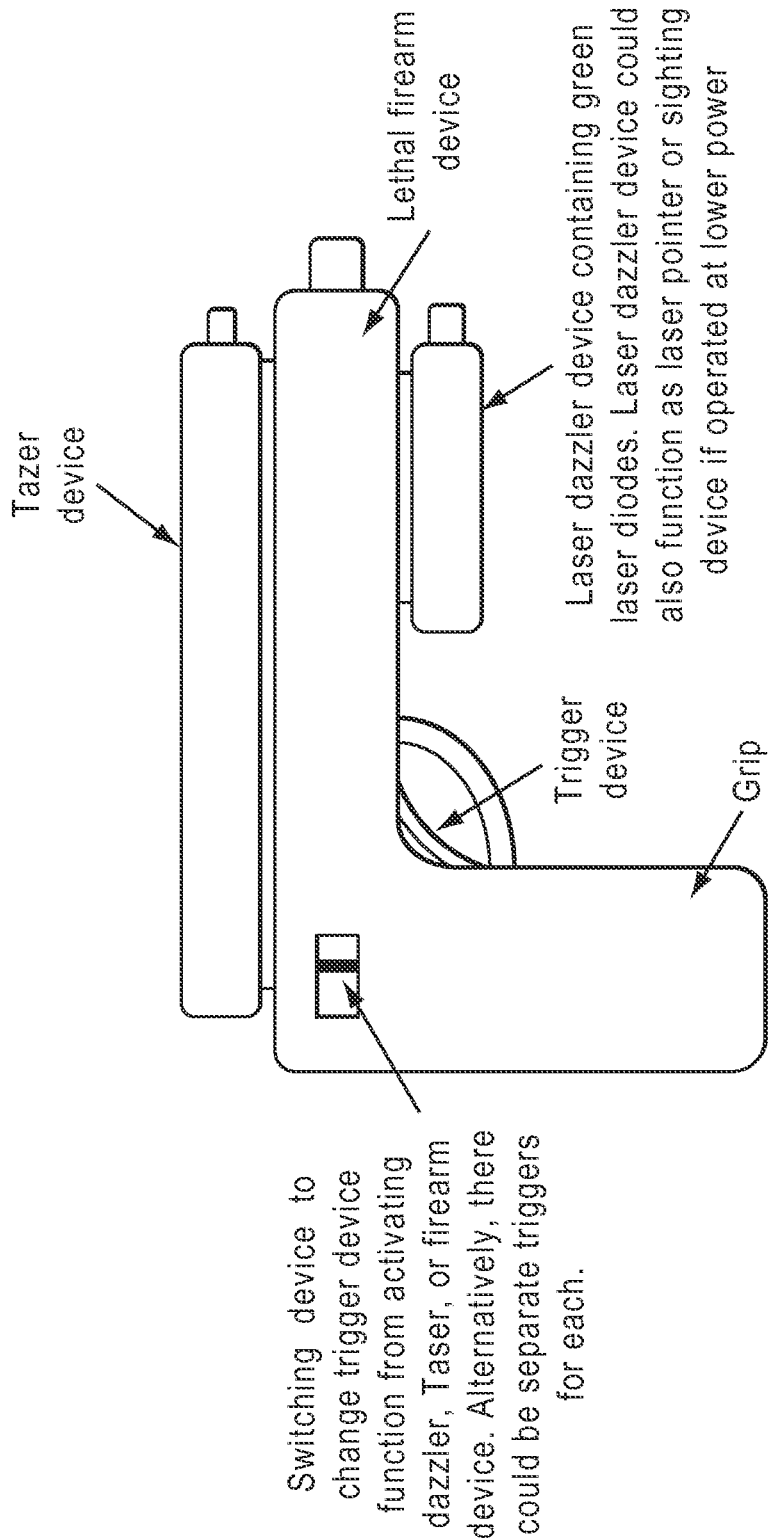
FIG. 10 shows an example of a multi-stage weapon according to certain embodiments.

FIG. 10 shows an example of a multi-stage weapon according to certain embodiments. The weapon shown in FIG. 10 includes a Taser device, a lethal firearm device, a trigger device, a grip, a laser dazzler device including green laser diodes, and a switching device. The laser dazzler device can optionally function as a laser pointer or a sighting device. The switching device can change the trigger device from activating the dazzler, Taser, or firearm device. Optionally, there may be a separate trigger for each function.

An example of a non-legal device is disclosed in U.S. Pat. No. 8,098,474, which is incorporated by reference in its entirety. The device has a cartridge for a system that uses a stimulus signal for immobilizing a human or animal target includes a propellant and a projectile propelled away from about the cartridge by the propellant. The projectile includes a power supply, a waveform generator, and several electrodes. The waveform generator is powered by the power supply. The waveform generator includes a processor. The electrodes complete a stimulus delivery circuit to conduct a current through the target. The waveform generator generates the current to include a first series of pulses and a second series of pulses. The second series begins after the first series is completed. The first series has a first pulse repetition rate determined by the processor. Each pulse of the first series has a first pulse width of from about 10 microseconds to about 1000 microseconds. Each pulse of the first series delivers through the target a first charge per pulse of from about 50 microcoulombs to about 500 microcoulombs. The second series has a second pulse repetition rate determined by the processor to be less than the first pulse repetition rate. Each pulse of the second series delivers through the target a charge greater than a minimum charge per pulse. A product of the second pulse repetition rate and the minimum charge per pulse is greater than 250.

In an example, the present techniques can be combined with a Taser device. A Taser is an electroshock weapon line sold by Taser International. It uses electrical current to disrupt voluntary control of muscles causing "neuromuscular incapacitation". Someone struck by a Taser experiences stimulation of his or her sensory nerves and motor nerves, resulting in strong involuntary muscle contractions. Tasers do not rely only on pain compliance, except when used in Drive Stun mode, and are thus preferred by some law enforcement personnel over non-Taser stun guns and other electronic control weapons.

In an alternative example, the techniques can be combined with pepper spray or other processes. In an example, pepper spray, also known as OC spray (from "Oleoresin *Capsicum*"), OC gas, and *capsicum* spray, is a lachrymatory agent (a chemical compound that irritates the eyes to cause tears, pain, and even temporary blindness) used in policing, riot control, crowd control, and personal self-defense, including defense against dogs and bears. Its inflammatory effects cause the eyes to close, taking away vision. This temporary blindness allows officers to more easily restrain subjects and permits persons using pepper spray for self-defense an opportunity to escape. Although considered a less-than-lethal agent, it has been deadly in rare cases, and concerns have been raised about a number of deaths in which pepper sprayed may have been a contributing factor.

In an example, the active ingredient in pepper spray is capsaicin, which is a chemical derived from the fruit of plants in the *Capsicum* genus, including chilies. Extraction of oleoresin *capsicum* from peppers requires *capsicum* to be finely ground, from which capsaicin is then extracted using an organic solvent such as ethanol. The solvent is then evaporated, and the remaining wax-like resin is the oleoresin *capsicum*. An emulsifier such as propylene glycol is used to suspend the OC in water, and pressurized to make it aerosol in pepper spray. The high performance liquid chromatography (HPLC) method is used to measure the amount of capsaicin and major capsaicinoids within pepper sprays. In an example, pepper spray is an inflammatory agent. It causes immediate closing of the eyes, difficulty breathing, runny nose, and coughing. The duration of its effects depends on the strength of the spray but the average full effect lasts around thirty to forty-five minutes, with diminished effects lasting for hours.

Embodiments of present invention is related to gallium and nitrogen laser diode devices. More specifically, embodiments of the present invention provide laser diode accessory devices containing one or more blue and/or green laser diodes characterized by a wavelength of about 420 nm to 500 nm or from 500 nm to 540 nm, respectively. In certain embodiments of the present invention, laser diode accessory devices containing one or more blue and/or green laser diodes characterized by a wavelength from about 420 nm to 540 nm are provided. The laser diode devices may operate at one or more wavelengths within the range of 420 nm to 540 nm, and which can be selected as suitable for a particular application. In various embodiments, the laser diode accessory devices include polar, non-polar, and/or semi-polar blue and/or green laser diodes. In a specific embodiment, the laser accessory device can serve various functionalities including a self-defense laser dazzler functioning to deter or temporarily incapacitate the subject matter, or a laser pointing device to project a laser beam onto an item or location, or a communication device where the laser beam is used to silently communicate a message from one location to another, or as a simple novelty device, a combination thereof, or other function. The blue or green laser diode accessory device can be configured to be integrated with or attached to a common and already widely deployed item such as a cell phone case, a cell phone, a smart phone, a camera, a key chain, a TV, a pen or pencil add-on, or other device.

In a preferred embodiment of the present invention the laser diode accessory device functions as a self-defense laser dazzler device to temporarily incapacitating a threatening subject or animal and providing safety to the user. The small size and high efficiency of the laser diode can enable the laser dazzler to be integrated with common items such as cell phones, cell phone cases, or key chains to provide a measure of self-defense to the user without having to carry a stand-alone self-defense item such as a bottle of pepper spray. As human beings become more civilized, non-lethal techniques have been developed to temporarily halt others that may be dangerous or hostile. In any potentially hostile situation such as a random attack on a civilian or a military security checkpoint, a critical need exists to identify potentially threatening individuals or groups prior to undertaking an escalation of force. Non-lethal threat detection and deterrent techniques are commonly used such as megaphones, tire spike strips, traffic cones, fencing, and hand gestures. However, many of these are impractical in impromptu security environments, and such measures may not show sufficient force to deter potentially hostile parties. If a serious threat is anticipated, warning shots can be fired, but this action may accelerate tensions and result in unwanted and unnecessary escalation of force if the shots are perceived incorrectly by the approaching party. Further, many civilians do not carry lethal firearms to fire warning shots from. Moreover, once the warning shots have been fired, a common next step in the escalation of force is to engage the approaching party directly with gunfire, which dramatically increases the likelihood of fatalities.

In an alternative preferred embodiment of the present invention the laser diode accessory device functions as a pointer device to project a laser beam onto a subject or a location to indicate a spatial location or object. Laser pointer devices are common in office settings for presentations such that a speaker can point toward the words or pictures that he/she is discussing to more clearly convey a message. In the prior art laser pointer configuration the laser pointer is typically a standalone object and is usually the size of a large pen or pencil. In certain embodiments of the present invention where green laser diodes and/or blue laser diodes are deployed as the laser source the size can be very small due to the tiny chip and package size and high efficiency reducing the power supply size. With this advance in laser technology laser pointers can be integrated into common objects such as cell phones, cell phone cases, key chains, and even as snap or slide-on accessories to pens and pencils. This transformative breakthrough of integrating laser pointer devices with common items will no longer limit laser pointers to the office setting and enable users to have continuous access to a laser pointer device. The effects of this continuous access will be many as pointers may become commonly used to point and indicate items or locations in every day settings. An example of this would be indicating an auto mechanic showing his client a failed component deep in the engine compartment that he could not otherwise touch with his hand due to inability to access it, the engine compartment is too hot to access, or the mechanic does not want to soil his hands.

In an alternative preferred embodiment of the present invention the laser diode accessory device functions as a communication device to silently signal a message to another party. The directionality of the laser beam makes it an ideal source for a line of sight or a specifically pointed beam of electromagnetic radiation such that the laser beam can be used to communicate to a precisely located subject without message interception. Several techniques can be deployed to carry the information ranging from the most basic message where the presence of the beam signals something specific to more complex messages carried by pulsing or modulating the laser beam in consistent with a telecommunications protocol.

In an example, photopic response peaks at 555 nm in humans when the eye is used to ambient light. In an example, scotopic response peaks at 507 nm, which occurs at very minimal light levels. Under "photopic" conditions, the rods are saturated and only the cones produce a visual signal. Under "scotopic" conditions, the light levels are too low to activate the cones, but the rods still respond. "Mesopic" conditions refer to the in-between state where both rods and cones are active, although there can be variations.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A laser dazzling apparatus comprising:
  a gallium and nitrogen containing laser diode device comprising a first stage, the first stage comprising a non-lethal light emitting stage; the laser diode device comprising an active region and a laser stripe region configured to emit a first laser beam characterized by one or more wavelengths from about 420 nm to about 540 nm, the active region comprising gallium and nitrogen containing material and having a plurality of well layers and barrier layers stacked in a first direction, the laser stripe region configured to project the first laser beam in a second direction substantially orthogonal to the first direction;
  a driving circuit electrically coupled to the laser diode device, the driving circuit being adapted to deliver electrical power to the laser diode device, the electrical power being less than 800 mW;
  a power source electrically coupled to the driving circuit;
  a sight for aligning the first laser beam; and
  a second stage, the second stage comprising a non-lethal stage.

2. The apparatus of claim 1, wherein,
  the laser diode device comprises a laser diode dazzler device; and
  the first laser beam is characterized by one or more wavelengths from about 500 nm to about 540 nm.

3. The apparatus of claim 1, wherein,
  the laser diode device comprises a laser diode dazzler device; and
  the first laser beam is characterized by one or more wavelengths from about 420 nm to about 500 nm.

4. The apparatus of claim 1, wherein the laser diode device comprises a laser pointer device.

5. The apparatus of claim 1, wherein the laser diode device comprises a laser aiming device.

6. The apparatus of claim 1, wherein the second stage comprises a laser diode dazzler device configured to emit a second laser beam characterized by a one or more wavelengths from about 420 nm to about 540 nm.

7. The apparatus of claim 6, wherein the second laser beam is characterized by one or more wavelengths from about 420 nm to about 500 nm, one or more wavelengths from about 500 nm to about 540 nm, or a combination thereof.

8. The apparatus of claim 1, wherein the second stage comprises a Taser device configured to emit an electroshock.

9. The apparatus of claim 1, wherein the second stage comprises a pepper spray emitting device.

10. The apparatus of claim 1, wherein the second stage comprises a rubber bullet projectile launching device.

11. The apparatus of claim 1, further comprising a third stage.

12. The apparatus of claim 11, wherein the third stage comprises a non-lethal stage.

13. The apparatus of claim 11, wherein the third stage comprises a lethal stage.

14. The apparatus of claim 13, wherein the lethal stage comprises a firearm.

15. The apparatus of claim 1, further comprising an optical concentrator aligned with the laser diode device.

16. The apparatus of claim 1, where the laser diode device comprises a green laser diode characterized by a polar {0001} surface orientation.

17. The apparatus of claim 1, where the laser diode device comprises a green laser diode characterized by a non-polar surface orientation.

18. The apparatus of claim 1, where the laser diode device comprises a green laser diode characterized by a semi-polar surface orientation.

19. The apparatus of claim 1, where the laser diode device comprises a green laser diode characterized by a semi-polar {20-21} surface orientation.

20. The apparatus of claim 1, wherein the laser diode device comprises a gallium and nitrogen containing bulk substrate.

21. The apparatus of claim 1, wherein the first laser beam is characterized by a power level less than 100 W.

22. The apparatus of claim 1, wherein the first laser beam is characterized by a power level less than 1 W.

23. The apparatus of claim 1, wherein the first laser beam is characterized by a power level less than 10 W.

24. The apparatus of claim 1, wherein the laser diode device comprises a plurality of green laser diodes, each of the plurality of green laser diodes characterized by emission in a wavelength range from 500 nm to 540 nm.

25. The apparatus of claim 1, wherein the laser diode device comprises a plurality of green laser diodes sharing a single package.

26. The apparatus of claim 1, further comprising an optic configured to adjust the size of the laser beam at a predetermined distance.

27. The apparatus of claim 1, wherein the sight is selected from an open sight, an aperture sight, a red dot sight, a holographic sight, a scope, and a combination of any of the foregoing.

28. The apparatus of claim 1, wherein the power source comprises a battery.

29. The apparatus of claim 1, wherein the driving circuit is configured to deliver pulsed electrical energy.

30. A method of deterring a subject, comprising:
    providing the apparatus of claim 1; and
    directing the first laser beam at the subject.

31. The method of claim 30, wherein the laser diode device comprises a laser diode dazzler device.

32. The method of claim 30, further comprising using the second stage.

* * * * *